United States Patent [19]
Kishimura

[11] Patent Number: 6,124,081
[45] Date of Patent: Sep. 26, 2000

[54] METHOD OF FORMING A RESIST PATTERN

[75] Inventor: Shinji Kishimura, Tokyo, Japan

[73] Assignee: Mitsubishi Denki Kabushiki Kaisha, Tokyo, Japan

[21] Appl. No.: 08/946,387

[22] Filed: Oct. 7, 1997

Related U.S. Application Data

[60] Continuation of application No. 08/656,490, May 31, 1996, abandoned, which is a division of application No. 08/527,467, Sep. 13, 1995, abandoned.

[30] Foreign Application Priority Data

Nov. 28, 1994 [JP] Japan .................................. 6-293015

[51] Int. Cl.$^7$ ...................................................... G03C 5/00
[52] U.S. Cl. .......................... 430/323; 430/322; 430/325; 430/326; 430/329; 430/330; 430/349; 430/350; 430/290
[58] Field of Search ..................................... 430/322, 325, 430/326, 329, 330, 349, 350, 290, 323

[56] References Cited

U.S. PATENT DOCUMENTS

| | | | |
|---|---|---|---|
| 4,609,615 | 9/1986 | Yamashita et al. | 430/325 |
| 4,801,518 | 1/1989 | Yamashita et al. | 430/325 |
| 5,208,133 | 5/1993 | Tsumori | 430/270 |
| 5,292,614 | 3/1994 | Ochiai et al. | 430/270 |
| 5,364,716 | 11/1994 | Nakagawa et al. | 430/325 |
| 5,389,491 | 2/1995 | Tani et al. | 430/170 |
| 5,472,813 | 12/1995 | Nakagawa et al. | 430/325 |

FOREIGN PATENT DOCUMENTS

| | | |
|---|---|---|
| 0 458 325 A1 | 11/1991 | European Pat. Off. . |
| 41 25 042 A1 | 2/1993 | Germany . |
| 42 28 269 A1 | 3/1993 | Germany . |
| 42 07 264 A1 | 9/1993 | Germany . |
| 63-299336 | 12/1988 | Japan . |
| 1-283931 | 11/1989 | Japan . |
| 5-45879 | 2/1993 | Japan . |
| 5-181277 | 7/1993 | Japan . |

*Primary Examiner*—Geraldine Letscher
*Attorney, Agent, or Firm*—McDermott, Will & Emery

[57] ABSTRACT

A negative type resist in which an alkali-soluble base resin, a crosslinking agent and an acid generating agent are dissolved in a solvent, wherein 10 through 50 wt % of the crosslinking agent and 0.5 through 20 wt % of the acid generating agent on the basis of 100 wt % of the alkali-soluble base resin are dissolved in the solvent.

20 Claims, 14 Drawing Sheets

| EXAMPLE | SENSITIVITY OF 0.3 µm LINE AND SPACE PATTERN (mJ/cm²) | LIMIT RESOLUTION OF LINE AND SPACE PATTERN (µm) | RESOLUTION DEPTH OF FOCUS OF 0.3 µm LINE AND SPACE PATTERN (µm) | SECTIONAL SHAPE OF 0.3 µm LINE AND SPACE PATTERN |
|---|---|---|---|---|
| 1 | 60 | 0.175 | 1.8 |  |
| 2 | 45 | 0.225 | 1.2 |  |
| 3 | 55 | 0.200 | 1.5 |  |
| 4 | 45 | 0.150 | 2.1 |  |
| COMPARATIVE EXAMPLE 1 | 70 | 0.300 | 0 |  |
| COMPARATIVE EXAMPLE 2 | 50 | 0.250 | 0.9 |  |

METHOD OF FORMING A RESIST PATTERN

This appln is a con 08/656,490 filed May 31, 1996, abn which is a div of 08/527,467, filed Sep. 13, 1995, abn.

BACKGROUND OF THE INVENTION

1. Field of the Invention

The present invention relates to a negative type resist for a resist layer which is formed on the surface of a layer for etching that is formed on a substrate and a method of forming a resist pattern for forming a resist pattern on the surface of the layer for etching by using the negative type resist.

2. Discussion of Background

At present, in manufacturing methods of large scale integrated circuits (LSI) represented by a 4M or 16M dynamic random access memory (DRAM), it is very important for performing a miniaturization, to form a resist pattern which is formed on the surface of a layer for etching, for instance, of an insulating layer or a wiring layer.

It is a general practice in forming a resist pattern that after coating a positive type photoresist comprising a novolak resin and naphthoquinonediazide on the surface of a layer for etching, g line beam (wavelength 436 nm) from a mercury lamp is selectively irradiated on the positive type photoresist layer and the layer is successively developed.

In recent times, in the dynamic random access memory, the integration degree thereof has been increased further to 16M or 64M.

When the integration degree is enhanced and the miniaturization process is promoted, i line beam (wavelength 365 nm) has been employed as a beam from a beam source for selectively irradiating to a resist layer.

When the integration degree of the large scale integrated circuit is enhanced and a resist pattern of a half $\mu$m or less is required from now on, it is difficult to manufacture stably the circuit when the resist pattern is formed by using the i line beam. Therefore, researches are beginning to carry out wherein a KrF excimer laser beam (wavelength 248 nm) is employed as a beam source having a shorter wavelength.

However, when a resist pattern is formed by selectively irradiating the KrF excimer laser beam to a positive type photoresist layer and by developing the layer, after coating the positive type photoresist comprising a novolak resin and naphthoquinonediazide on the surface of a layer for etching which has been employed for the g line beam or the i line beam from a mercury lamp, side walls of the pattern having faces orthogonal to the surface of the layer for etching can not be provided and a resist pattern having a high resolution can not be provided, since beam absorption is considerable in the positive type resist.

Accordingly, the following two resists have been proposed as the resist for the KrF excimer laser beam.

The first one is a chemically amplified positive type resist having two components comprising a base resin and an acid generating agent which generates an acid by receiving a light beam or three components comprising the above two components added with a dissolution restraining agent, which is easy to dissolve in an alkaline developer when an acid from the acid generating agent accelerates a polarity change reaction in a dissolution restraining protection group of the base resin or the dissolution restraining agent by performing a baking operation.

The second one is a chemically amplified negative type resist comprising a base resin, a crosslinking agent and an acid generating agent which generates an acid by receiving a light beam, which is hardened when the acid from the acid generating agent accelerates a crosslinking reaction between the base resin and the crosslinking agent by performing a baking operation.

However, in the above chemically amplified positive type resist, the acid from the acid generating agent which has generated by receiving a light beam is neutralized by a deactivating substance in environment (the acid is evaporated from the surface layer of the resist layer into the environment), by which the ratio of the polarity change reaction through the baking operation before developing is decreased, the surface layer of the resist layer is difficult to dissolve in the developer. Thereby, a phenomenon (T-Top) is caused wherein eaves are formed on the head portion of the resist pattern or a phenomenon (Skin) is caused wherein the head portions of the contiguous portions of the resist pattern are in connection with each other. Further, the acid from the acid generating agent which has been generated by receiving a light beam is neutralized by a deactivating substance on the surface of a layer for etching (the acid is diffused from portions of the resist layer contacting the layer for etching to the layer for etching), by which the ratio of the polarity change reaction is decreased through the baking operation before developing, the portions of the resist layer contacting the layer for etching are difficult to dissolve into the developer, and as a result, trails or residues are caused in the resist pattern. Such phenomena of the resist pattern are problematic in the etching operation for the layer for etching, and therefore, a resist pattern having a high resolution is difficult to obtain.

Further, also in the chemically amplified negative type resist, the acid from the acid generating agent which has generated by receiving a light beam is neutralized by a deactivating substance in environment (the deactivating substance is diffused from the environment to the surface layer of the resist layer) by which the ratio of the crosslinking reaction is decreased through the baking operation before developing, the surface layer of the resist layer is difficult to harden, and the head portions of the resist pattern are provided with a rounded shape. Further, the acid from the acid generating agent which has been generated by receiving a light beam is neutralized by a deactivating substance on the surface of a layer for etching (the deactivating substance is diffused from the layer for etching to the portions of the resist layer contacting the layer for etching) by which the ratio of the crosslinking reaction is decreased through the baking operation before developing, the portions of the resist layer contacting the layer for etching are difficult to harden and the resist pattern is provided with an undercut shape.

The rounding shape of the head portions and the undercut of the resist pattern which are observed in the chemically sensitizing negative type resist are not so problematic in etching the layer for etching. Further, in principle, the chemically amplified negative type resist utilizes the crosslinking reaction of a resin. Therefore, the thermal resistance thereof is considerable, the mechanical strength thereof is provided with a large value and the deformation of the resist pattern is extremely limited. Accordingly, the chemically amplified negative type resist is superior to the chemically amplified positive type resist in regard with a resist pattern that is employed in hard etching, highly-dosed ion implantation or high energy ion implantation wherein the temperature of the resin is substantially elevated.

However, the following problems have been caused when the chemically amplified negative type resist was coated on the surface of the layer for etching, the resist was prebaked, the KrF excimer laser beam was selectively irradiated on a resist layer comprising the chemically amplified negative type resist, the resist was baked and the resist was developed, to provide a resist pattern of a half μm or less.

Firstly, in the exposure region of the resist layer irradiated with the KrF excimer laser beam, a portion of the film was reduced at the surface of the resist layer, and an encroachment was caused in the portions of the resist layer contacting the layer for etching.

This is because, in the exposure region of the resist layer, the amount of acid from the acid generating agent is reduced by a neutralization reaction caused by a basic substance on the surface of the resist and in the portions of the resist proximate to the surface, and in the portions of the resist contacting the layer for etching, by which the crosslinking density is lowered. As a result, the dissolution rate with respect to the developer immediately before the developing operation on the surface and in the portions proximate to the surface of the resin, and the portions of the resin contacting the layer for etching, becomes faster in comparison with those in the other portions.

Secondly, waviness of the side walls of the developed resist pattern, that is, a ruggedness thereof became conspicuous.

This is due to a fact wherein the dissolution rate in the exposure region of the resist layer is periodically distributed in the depth direction by a standing wave caused by an interference between an incident beam of the KrF excimer laser beam that is incident on the exposure region of the resist layer and a reflecting beam from the surface of the layer for etching.

Thirdly, there caused a variation in the resist film thickness of the resist pattern or a variation in dimensions of the resist.

These are caused by a variation in the reflectance of the surface of the layer for etching.

Fourthly, the difference between the dissolution rates with respect to the developer in the exposure region and the non-exposure region of the resist layer, at the portions of the resist layer contacting the layer for etching, was not made large, and therefore, the resolution was poor.

This is due to a fact wherein, in the exposure region of the resist layer, the dissolution rate with respect to the developer in the portions of the resist layer contacting the layer for etching, is faster than the dissolution rate of the portions of the resist layer on the surface thereof.

As a result, a sufficient resolution and a wide range of depth of focus were not provided, and an excellent shape of the resist pattern was not achieved.

SUMMARY OF THE INVENTION

This invention was carried out in view of these situations, and it is an object of the present invention to provide a negative type resist and a method of forming a resist pattern whereby a high resolution is achieved, a wide range of depth of focus is provided and an excellent shape of a resist pattern is provided.

According to a first aspect of the present invention, there is provided a negative type resist in which an alkali-soluble base resin, a crosslinking agent and an acid generating agent are dissolved in a solvent, wherein 10 through 50 wt % of the crosslinking agent and 0.5 through 20 wt % of the acid generating agent on the basis of 100 wt % of the alkali-soluble base resin are dissolved in the solvent.

According to a second aspect of the present invention, there is provided a negative type resist in which an alkali-soluble base resin, a crosslinking agent and an acid generating agent are dissolved in a solvent, wherein 20 through 40 wt % of the crosslinking agent and 3 through 15 wt % of the acid generating agent on the basis of 100 wt % of the alkali-soluble base resin are dissolved in the solvent.

According to a third aspect of the present invention, there is provided a method of forming a resist pattern comprising:

a step of forming a resist layer comprising a negative type resist of which dissolution rate with respect to a developer is 3,000 Å/sec or more at a surface layer of the resist layer, on a surface of a substrate by coating the negative type resist on the surface of the substrate and by prebaking the negative type resist, said negative type resist becoming slightly soluble or insoluble to the developer when a chemical change is caused to a substance generated by receiving a radiation such as a light beam or an electron beam by baking, or when a chemical change is caused in a substance by receiving the radiation;

a total face irradiation step for irradiating the radiation on a total of the surface of the resist layer through an opaque reticle;

a selective irradiation step for irradiating the radiation on the surface of the resist layer through a reticle formed with a desired pattern; and a step of providing a resist pattern by developing the resist layer irradiated with the radiation in the total face irradiation step and the selective irradiation step by the developer.

According to a fourth aspect of the present invention, there is provided a method of forming a resist pattern comprising:

a step of forming a resist layer on a surface of a substrate comprising a negative type resist by coating the negative type resist on the surface of the substrate and by prebaking the negative type resist, said negative type resist becoming slightly soluble or insoluble to a developer when a chemical change is caused in a substance generated by receiving a radiation such as a light beam or an electron beam by baking;

a total face irradiation and baking step for irradiating the radiation on a total of a surface of the resist layer through an opaque reticle and baking the resist layer thereafter;

a selective irradiation and baking step for irradiating the radiation on the surface of the resist layer through a reticle formed with a desired pattern and baking the resist layer thereafter; and a step of providing a resist pattern by developing the resist layer irradiated with the radiation in the total face irradiation and baking step and the selective irradiation and baking step.

According to a fifth aspect of the present invention, there is provided a method of forming a resist pattern comprising:

a step of forming a resist layer comprising a negative type resist on a surface of a substrate by coating the negative type resist on the surface of the substrate and prebaking the negative type resist, said negative type resist becoming slightly soluble or insoluble to a developer when a chemical change is caused in a substance generated by receiving a radiation such as a light beam or an electron beam by baking or when a chemical change is caused in a substance by receiving the irradiation;

a total face irradiation step for irradiating the radiation on a total of a surface of the resist layer;

a selective irradiation step for irradiating the radiation on the surface of the resist layer through a reticle formed with a desired pattern;

step of providing a resist pattern by developing the resist layer irradiated with the radiation in the total face irradiation step and the selective irradiation step by the developer; and wherein a first effective exposure amount applied on the resist layer irradiated with the radiation in the total face irradiation step is 5 through 15% of a second effective exposure amount applied on an exposure region of the resist layer irradiated with the radiation in the selective irradiation step.

According to a sixth aspect of the present invention, there is provided a method of forming a resist pattern comprising:

a step of forming a resist layer comprising a negative type resist on a surface of a substrate by coating the negative type resist on the surface of the substrate and by prebaking the negative type resist, said negative type resist becoming slightly soluble or insoluble to a developer when a chemical change is caused in a substance generated by receiving a radiation such as a light beam or an electron beam by baking or when a chemical change is caused in a substance by receiving the radiation;

an irradiation step for irradiating the radiation on a surface of the resist layer through a reticle formed with a desired pattern comprising a light transmitting region and a light shielding layer having a light transmittance of 1 through 20%; and a step of providing a resist pattern by developing the resist layer irradiated with the radiation in the irradiation step by the developer.

According to a seventh aspect of the present invention, there is provided a method of forming a resist pattern comprising:

a resist layer forming step for forming a resist layer comprising a negative type resist on a surface of a substrate by coating the negative type resist on the surface of the substrate and by prebaking the negative type resist, said negative type resist becoming slightly soluble or insoluble to a developer when a chemical change is caused in a substance generated by receiving a radiation such as a light beam or an electron beam by baking or when a chemical change is caused in a substance by receiving the radiation;

an irradiation step for irradiating the radiation on a surface of the resist layer through a reticle formed with a desired pattern comprising a light transmitting region and a light shielding layer having a light transmittance of 3 through 15%; and a step for providing a resist pattern by developing the resist layer irradiated with the radiation in the irradiation step by the developer.

According to the first aspect of the present invention, after coating 10 through 50 wt % of the crosslinking agent on the basis of 100 wt % of the alkali-soluble base resin, on the surface of the substrate, the crosslinking agent promotes the dissolution rate of the resist layer with respect to the developer before the irradiation of the radiation, whereby, in the developing operation, the contrast of the dissolution rate with respect to the developer in the exposure region of the resist layer as compared with that in the non-exposure region is promoted.

According to the second aspect of the present invention, after coating 20 through 40 wt % of the crosslinking agent on the basis of 100 wt % of the alkali-soluble base resin, on the surface of the substrate, the crosslinking agent promotes the dissolution rate of the resist layer with respect to the developer before the irradiation of the radiation, whereby, in the developing operation, the contrast of the dissolution rate with respect to the developer in the exposure region of the resist layer as compared with that in the non-exposure region is promoted.

According to the third aspect of the present invention, the resist layer comprising the negative type resist wherein the dissolution rate with respect to the developer is 3,000 Å/sec or more at the surface layer thereof, is formed. In the developing operation, the contrast of the dissolution rate with respect to the developer in the exposure region of the resist layer as compared with that in the non-exposure region, is promoted particularly on the side of the portions of the resist layer contacting the substrate, the total face irradiation step lowers the dissolution rate of the resist layer on the surface portion and the portions contacting the substrate in the exposure region, and the difference between the dissolution rates in the exposure region and the non-exposure region of the resist layer on the side of the portions contacting the substrate, is rendered to be larger than the difference between the dissolution rates in the exposure region and the non-exposure region of the resist layer at the surface portion.

According to the fourth aspect of the present invention, the total face irradiation operation in the total face irradiation and baking step, lowers the dissolution rates at the surface portion of the resist layer and the portions thereof contacting the substrate in the exposure region, the difference between the dissolution rates of the resist layer between the exposure region and the non-exposure region on the side of the portions contacting the substrate, is rendered to be larger than the difference between the dissociation rates of the resist layer between the exposure region and the non-exposure region at the surface portion, and the baking operation of the resist layer that is carried out between the total face irradiation of the resist layer and the selective irradiation thereof, reduces the influence of a standing wave of the radiation in the exposure region of the resist layer.

According to the fifth aspect of the present invention, the total face irradiation step lowers the dissolution rates at the surface portion of the resist layer and the portions thereof contacting the substrate in the exposure region, and renders the difference between the dissolution rates of the resist layer of the exposure region and the non-exposure region on the side of the portions thereof contacting the substrate to be larger than the difference between the dissolution rates of the resist layer of the exposure region and the non-exposure region at the surface portion.

According to the sixth aspect of the present invention, the irradiation step lowers the dissolution rates of the resist layer at the surface portion and at the portions thereof contacting the substrate in the exposure region, and renders the difference between the dissolution rates of the resist layer of the exposure region and the non-exposure region on the side of the portions thereof contacting the substrate to be larger than the difference of the dissolution rates of the resist layer between the exposure region and the non-exposure region at the surface portion.

According to the seventh aspect of the present invention, the irradiation step lowers the dissolution rates of the resist layer at the surface portions and the portions thereof contacting the substrate in the exposure region, and renders the difference of the dissolution rates of the resist layer between the exposure region and the non-exposure region on the side of the portions thereof contacting the substrate to be larger than the difference of the dissolution rates of the resist layer between the exposure region and the non-exposure region at the surface portion.

DETAILED DESCRIPTION OF PREFERRED EMBODIMENTS

EXAMPLE 1

An explanation will be given of Example 1 of this invention as follows in reference to FIGS. 1 through 8.

Firstly, an explanation will be given of a resist A which was employed in Example 1. The resist A comprises the following composition, which is "a negative type resist that is difficult to dissolve in a developer when a chemical change is caused in a substance generated by receiving a radiation, by baking".

(Resist A)

Alkali-soluble base resin

Poly-P-hydroxystyrene: 20 parts by weight

Crosslinking agent

Hexamethoxymethylmelamine: 7 parts by weight

Acid generating agent 1,2,3,4-tetrabromobutane: 0.6 part by weight

Solvent

Methyl 3-methoxypropionate

Next, an explanation will be given of a method of forming a resist pattern using the resist A.

Figure 1:
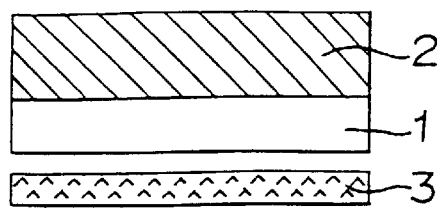
FIG. 1 is a partial sectional view showing Example 1 of this invention in the order of steps.

First, the resist A is spincoated on the surface of a substrate 1 such as a semiconductor wafer which is formed with a layer for etching (for instance, insulating layer), as shown in FIG. 1. A resist layer 2 is formed on the surface of the substrate 1 by prebaking the substrate 1 in which the resist A has been spincoated on a hot plate 3 that is a heating means, at 100° C. for 70 seconds.

As a condition of spincoating, the spincoating was performed such that the film thickness of the resist layer 2 became 1 μm when the prebaking had been performed.

At this instance, the dissolution rate of the resist layer 2 which had been formed on the surface of the substrate 1 with respect to a developer, for instance, an aqueous solution of 1.23 wt % of tetramethylammonium hydroxide (for instance, NMD-3 made by Tokyo Ohka Kogyo Co., LTD), was 3,500 Å/sec at the surface layer of the formed resist 2. The dissolution rate of the resist layer 2 with respect to the developer is fast, since it contains much crosslinking agent. That is, although the dissolution rate of the base resin that is a high-molecular compound (in case of poly-P-hydroxystyrene, the weight-average molecular weight Mw is 5,000 or less) is retarded (approximately 500 Å/sec$^2$ or less) since it is hard, it becomes softer in accordance with addition of the crosslinking agent that is a low-molecular compound to the base resin, and the dissolution rate is enhanced.

Further, the developer of the resist layer 2 is not restricted to the above Example and any developer can be employed so far as it is an alkaline aqueous solution.

Figure 2:
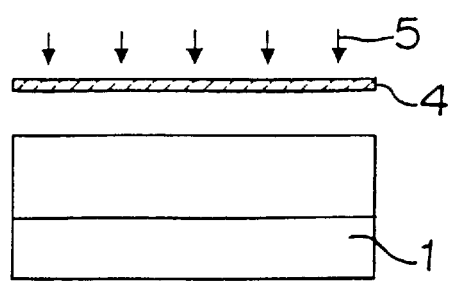
FIG. 2 is a partial sectional view showing Example 1 of this invention in the order of steps.

Next, as shown in FIG. 2, an exposure device, for instance, a KrF excimer stepper, (for instance, NSR2005EX8A, made by Nippon Kogaku K.K.) is employed, an opaque reticle 4 having the light transmittance of 10% is disposed on the surface of the formed resist layer 2, a KrF excimer laser beam 5 having the wavelength of 248 nm is irradiated from above the opaque reticle in a range of 10 through 50 mJ/cm$^2$, and the excimer laser beam 5 is irradiated on the total face of the resist layer 2 through the opaque reticle 4.

The opaque reticle 4 at this instance is formed with an opaque layer composed of chromium (Cr), molybdenum silicide (MoSi) or oxinitrides of these, on the total surface of a transparent substrate such as glass, and the light transmittance thereof is rendered to be 10%, which serves to irradiate the excimer laser beam 5 on the resist layer 2 after reducing the energy of the original excimer laser beam 5 from the exposure device.

Further, although the opaque reticle 4 was provided with 10% of the light transmittance, the transmittance may be in a range of 1 through 50%, preferably in a range of 5 through 15%.

Figure 3:
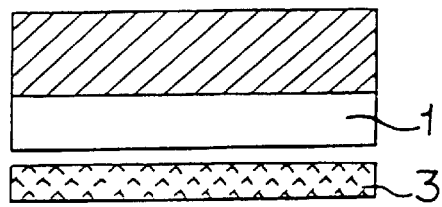
FIG. 3 is a partial sectional view showing Example 1 of this invention in the order of steps.

As shown in FIG. 3, a baking operation is performed with respect to the substrate 1 which has been irradiated with the excimer laser beam on the total surface of the resist layer 2 thereof on the hot plate 3 that is the heating means, at 100° C. for 90 seconds.

By the baking operation, the thickness of the resist layer 2 which has been formed on the substrate 1 is more or less reduced in comparison with that before baking.

Figure 4:
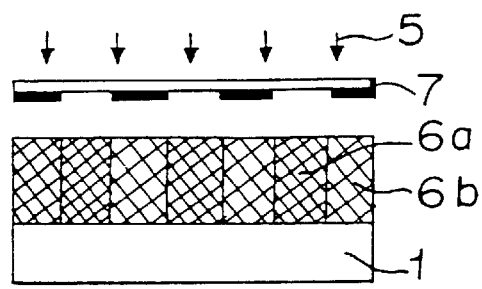
FIG. 4 is a partial sectional view showing Example 1 of this invention in the order of steps.

Next, as shown in FIG. 4, the same exposure device which has been used in the total irradiation step shown in FIG. 2 is employed, a reticle 7 that is formed with a desired pattern is disposed on the surface of the resist layer 2, the KrF excimer laser beam 5 having the wavelength of 248 nm is irradiated from above the reticle 7 in a range of 5 through 100 mJ/cm$^2$, preferably 10 through 50 mJ/cm$^2$, and the excimer laser beam 5 is selectively irradiated on the surface of the resist layer 2 through the reticle 7, thereby forming an image on the resist layer 2. That is, the resist layer 2 is divided into an exposure region 6a and a non-exposure region 6b based on the pattern formed on the reticle 7.

Figures 7A, 7B, 7C:
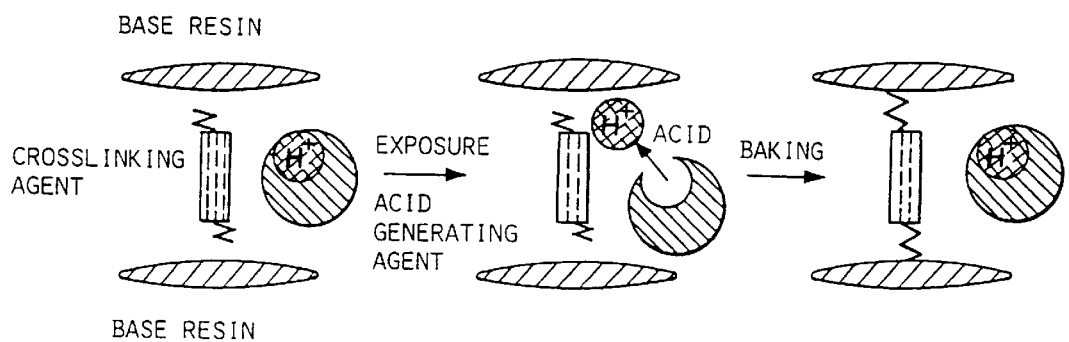
FIGS. 7(a), 7(b) and 7(c) are schematic illustrations showing a reaction of a negative type resist which is used in Example 1 of this invention.

As shown in FIG. 7(b), in the exposure region 6a of the resist layer 2, an acid is generated from the acid generating agent. The non-exposure region 6b of the resist layer 2 is in a state as shown in FIG. 7(a).

Figure 5:
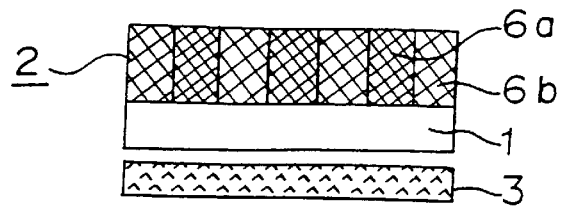
FIG. 5 is a partial sectional view showing Example 1 of this invention in the order of steps.

The reticle 7 is formed with a beam shielding layer (the light transmittance is 0%) composed of a desired pattern on the surface of a transparent substrate such as glass, that is, formed with a beam shielding layer at a portion thereof corresponding to a portion of the resist to be removed and formed with a beam transmitting region corresponding to a portion of the resist to be preserved. The beam shielding layer is formed by chromium (Cr), molybdenum silicide (MoSi) or oxinitrides of these. Thereafter, as shown in FIG. 5, the baking was performed with respect to the substrate 2 having the resist layer 2 composed of the exposure region 6a and the non-exposure region 6b above the hot plate 3 that is the heating means, at 100° C for 90 seconds. As shown in FIG. 7(c), in the exposure region 6a of the resist layer 2, the acid generated from the acid generating agent operates as a catalyst, and a crosslinking reaction is caused between the crosslinking agent and the base resin, whereby the exposure region 6a of the resist layer 2 is hardened. This baking operation is called the post-exposure baking (PEB). Further, in the non-exposure region 6b of the resist layer 2, no crosslinking reaction is caused between the crosslinking agent and the base resin since no acid is generated from the acid generating agent.

Figure 8:
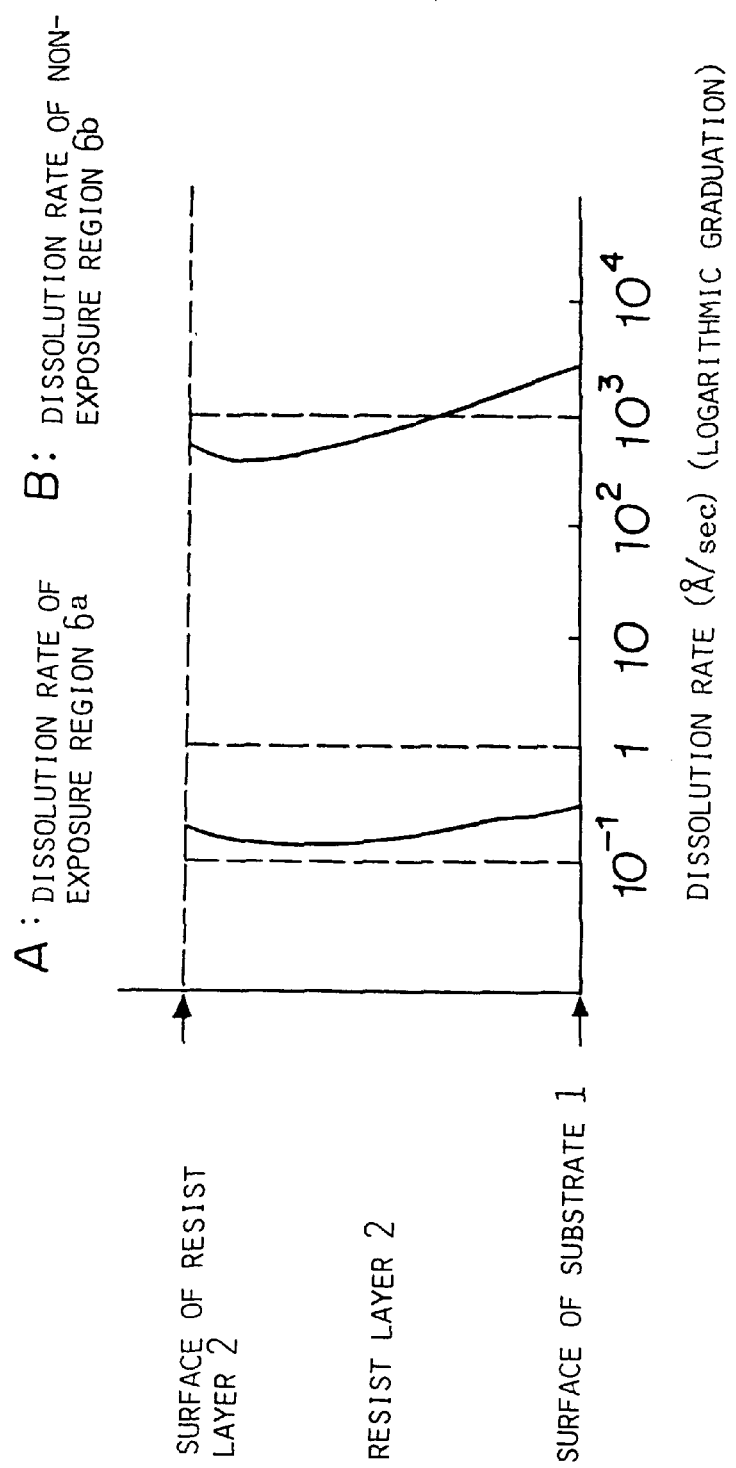
FIG. 8 is a diagram showing dissolution rates of a resist layer 2 with respect to a developer in an exposure region and a non-exposure region thereof before development in Example 1 of this invention.

A result as shown in FIG. 8 was provided by measuring the dissolution rate of the resist layer 2 comprising the exposure region 6a and the non-exposure region 6b formed as above, with respect to the developer immediately before developing. In FIG. 8, line A designates the distribution of the dissolution rate of the resist layer 2 with respect to the developer from the surface of the resist layer 2 to the surface of the substrate 1 in the exposure region 6a, whereas line B designates the distribution of the dissolution rate of the resist layer 2 with respect to the developer from the surface of the resist layer 2 to the surface of the substrate 1 in the non-exposure region 6b.

Figure 6:
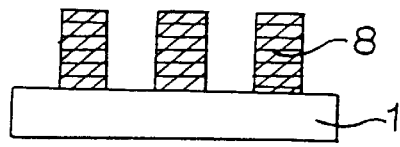
FIG. 6 is a partial sectional view showing Example 1 of this invention in the order of steps.

Further, a developing operation was performed by using the developer, or "NMD-3 made by Tokyo Ohka Kogyo Co., LTD" which is an aqueous solution of 1.23 wt % of tetramethylammonium hydroxide, for 100 seconds by the spray-paddle method, thereby obtaining a resist pattern as shown in FIG. 6.

Figure 9:
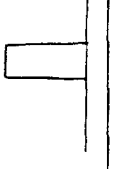
FIG. 9 is a diagram showing a measurement result of resist patterns in Examples of this invention and Comparative Examples.
Figure 9:
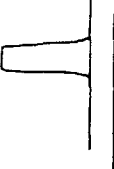
Figure 9:
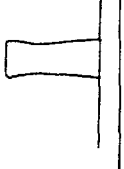
Figure 9:
Figure 9:
Figure 9:
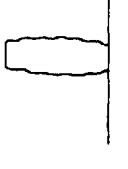

A result as shown in FIG. 9 was provided when with respect to the resist pattern 8 obtained as above, measurements were performed on a sectional shape of 0.3 μm line and space pattern, a sensitivity of 0.3 μm line and space pattern (exposure beam amount in finishing the resist pattern as specified by mask dimension), a limit resolution of line and space pattern, and a resolution depth of focus of 0.3 μm line and space pattern.

There are almost no rounding of the surface portions of the resist and no encroachment in the portions thereof contacting the substrate 1, in the sectional shape of the resist pattern 8 and the sectional shape is in an approximately rectangular shape in which side walls thereof have faces orthogonal to the approximately flat substrate 1. The sensitivity of 0.3 μm line and space pattern is 60 mJ/cm$^2$, and the limit resolution of line and space pattern is 0.175 μm which is a resolution sufficiently smaller than those in Comparative Examples, mentioned later whereby the function of the resist pattern is improved. The resolution depth of focus of 0.3 μm line and space pattern is 1.8 μm which is larger than those in Comparative Examples, mentioned later. Therefore, a wide range of depth of focus and therefore, the resist pattern having an improve function were provided.

The reason for obtaining the resist pattern 8 having the high resolution, the broad focus allowance and the improved shape, is considered to be as follows.

As is apparent in FIG. 8, showing the dissolution rate of the resist layer with respect to the developer immediately before developing, the dissolution rate of the resist layer 2 with respect to the developer distributing from the surface of the resist layer 2 to the surface of the substrate 1 in the exposure region 6(a), is within a range of approximately 0.1 through 0.5 Å/sec which stays approximately the same. Further, the dissolution rate of the resist layer 2 with respect to the developer distributing from the surface of the resist layer 2 to the surface of the substrate 1 in the non-exposure region 6b, is within a range of approximately 800 through 2,000 Å/sec, having an inconsiderable variation.

Accordingly, in the exposure region 6a of the resist layer 2, the effectively absorbed exposure amount is increased, the hardening reaction is accelerated and the dissolution rate with respect to the developer is lowered by the twice irradiation steps of the total irradiation step shown in FIG. 2 and the selective irradiation step shown in FIG. 4. The total face irradiation step shown in FIG. 2 is carried out prior to the selective irradiation step shown in FIG. 4, and therefore, the acid from the acid generating agent in the vicinity of the surface of the resist layer 2 which has been generated in the total face irradiation step shown in FIG. 2, is reduced whereby the degree of hardening in the vicinity of the surface can be more or less reduced. The dissolution rate with respect to the developer distributing from the surface of the resist layer 2 to the surface of the substrate 1 stays approximately the same. Accordingly, the rounding of the surface portions of the resist pattern 8 which has been preserved after it is developed by the developer (corresponding to the exposure region 6a of the resist layer 2), and the encroachment of the portions of the resist contacting the substrate 1 are restrained, and the side walls are provided with approximately flat vertical faces.

In the exposure region 6a of the resist layer 2, the dissolution rate with respect to the developer stays the same from the surface of the resist layer 2 to the surface of the substrate 1 due to the following reason. That is, the thicknesses of the resist layers 2 are different between the total face irradiation step shown in FIG. 2 and the selective irradiation step shown in FIG. 4, since the baking step of the resist layer 2 shown in FIG. 3 is performed between the total irradiation step of the excimer laser beam 5 shown in FIG. 2 and the selective irradiation step of the excimer laser beam 5 shown in FIG. 4. Therefore, a standing wave of the excimer laser beam 5 (a wave caused by an interference between the incident beam that is incident on the resist layer 2 and the reflecting beam reflected from the surface of the substrate 1) in the total face irradiation step shown in FIG. 2 at the exposure region 6a of the resist layer 2, and a standing wave of the excimer laser beam 5 in the selective irradiation step shown in FIG. 4, function to cancel each other, by which the dissolution rate of the resist layer 2 with respect to the developer distributing from the surface of the resist layer 2 to the surface of the substrate 1, is rendered to maintain constant.

Further, in the non-exposure region 6b of the resist layer 2, the beam absorption amount of the excimer laser beam 5 in the total face irradiation step shown in FIG. 2 is increased in the portions thereof proximate to the surface, and the portions are easy to harden. Therefore, the dissolution rate with respect to the developer is lowered to approximately 800 Å/sec in comparison with 3,500 Å/sec of the dissolution rate with respect to the developer before irradiating the excimer laser beam 5. Although the hardening reaction is caused on the topmost surface thereof by the excimer laser beam 5 in the total face irradiation step shown in FIG. 2, the degree of lowering of the dissolution rate is smaller than the lowering of the dissolution rate at the portions of the resist proximate to the surface due to evaporation of the acid which has been generated by the excimer laser beam 5 and a reaction between the resist and basic substances in the atmosphere. The dissolution rate with respect to the developer is the most enhanced at the portions of the resist contacting the substrate 1. The dissolution rate of the resist layer 2 with respect to the developer distributing from the surface of the resist layer 2 to the surface of the substrate 1 is provided with little variation and is within a range of approximately 800 through 2,000 Å/sec. Further, the difference between the dissolution rates of the resist layer 2 of the exposure region 6a and the non-exposure region 6b on the side of the portions of the resist layer contacting the substrate 1 is larger than the difference between the dissolution rates of the resist layer 2 of the exposure region 6a and the non-exposure region 6b at the surface portion of the resist layer 2.

Accordingly, there is a difference by four digits or more between the dissolution rate in the non-exposure region 6b in the resist layer 2 and the dissolution rate in the exposure region 6a of the resist layer 2 throughout the resist from the surface of the resist layer 2 to the surface of the substrate 1, the pattern can be formed in a good shape even when it is of 0.3 μm or less, and the difference between the dissolution rates in the portions of the resist contacting the substrate 1 is larger than the difference between the dissolution rates on the surface of the resist layer 2. Therefore, the high resolution can be provided.

EXAMPLE 2

In Example 2, only the composition of the resist is different from that in Example 1, the following resist B is employed in place of the resist A shown in Example 1 , and the resist pattern 8 is provided in accordance with the order of steps shown in FIGS. 1 through 6 similar to Example 1.
(Resist B)
Alkali-soluble base resin
Poly-P-hydroxystyrene: 20 parts by weight
Crosslinking agent
Hexamethoxymethylmelamine: 4 parts by weight
Acid generating agent
1,2,3,4-tetrabromobutane: 0.6 part by weight
Solvent
Methyl 3-methoxypropionate The resist B is "a negative type resist which is difficult to dissolve into a developer when a chemical change is caused in a substance generated by receiving a radiation by baking", similar to the resist A.

Figure 10:
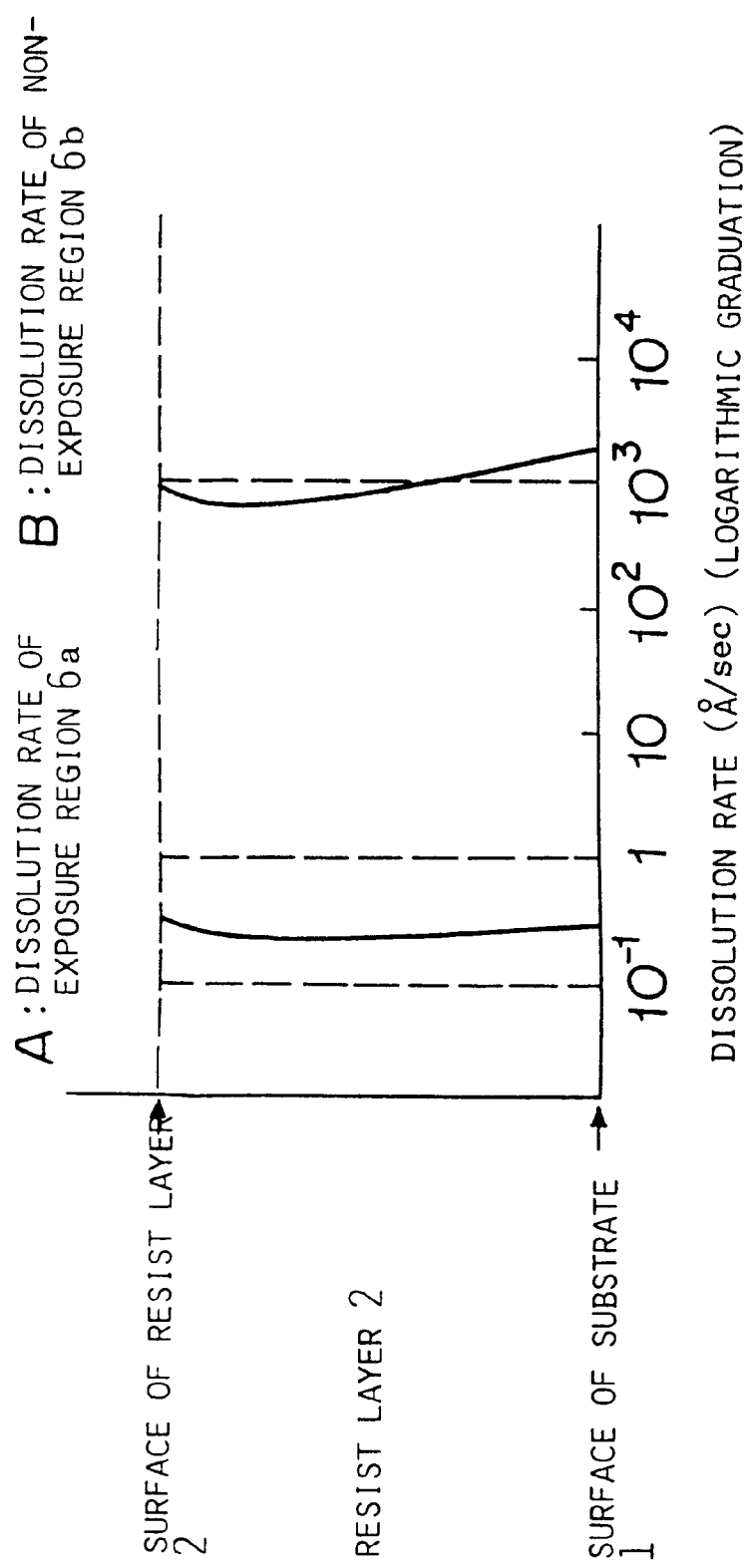
FIG. 10 is a diagram showing dissolution rates of a resist layer 2 with respect to a developer in an exposure region and a non-exposure region before development in Example 2 of this invention.

In Example 2 wherein the resist pattern 8 is formed in accordance with the order of steps shown in FIGS. 1 through 6 similar to Example 1, after the step shown in FIG. 1, the dissolution rate of the resist layer 2 which has been formed on the surface of the substrate 1, with respect to a developer, for instance, an aqueous solution of 1.23 wt % of tetramethylammonium hydroxide, (for instance, NMD-3 made by Tokyo Ohka Kogyo Co., LTD) is 15,000 Å/sec at the surface layer of the formed resist layer 2. A result shown in FIG. 10 was provided by measuring the dissolution rate of the resist layer 2 comprising the exposure region 6a and the non-exposure region 6b with respect to the developer immediately before developing, after the step shown in FIG. 5. In FIG. 10, line A designates the distribution of the dissolution rate of the resist layer 2 with respect to the developer from the surface of the resist layer 2 to the surface of the substrate 1 in the exposure region 6a, whereas line b designates the dissolution rate of the resist layer 2 from the surface of the resist layer 2 to the surface of the substrate 1 in the non-exposure region 6b.

A result shown in FIG. 9 was provided in the resist pattern 8 obtained as above, by measuring the sectional shape of 0.3 μm line and space pattern, the sensitivity of 0.3 μm line and space pattern (exposure beam amount in finishing the resist pattern as specified by mask dimensions), the limit resolution of line and space pattern and the resolution depth of focus of 0.3 μm line and space pattern.

Although the sectional shape of the resist pattern 8 is provided with more or less roundings on the surface portion and encroachments of the resist 2 contacting the substrate 1 in comparison with that in Example 1, the side walls are provided with faces approximately orthogonal to the approximately flat substrate 1. The sensitivity of the 0.3 μm line and space pattern is 45 mJ/cm$^2$, and the limit resolution of lien and space pattern is 0.225 μm which are a little larger than those in Example 1, however, sufficiently smaller than those in Comparative Examples, mentioned later. Therefore, the function is improved since a sufficient resolution is provided. The resolution depth of focus of 0.3 μm line and space pattern is 1.2 μm which is a little smaller than that in Example, 1 however, larger than those in Comparative Examples, mentioned later. Therefore, the function is improved since a broad range of depth of focus is provided.

The reason for obtaining the resist pattern 8 having such a high resolution, the broad range of the focus allowance and the excellent shape is considered to be as follows.

As is apparent from FIG. 10 showing the dissolution rate of the resist layer 2 with respect to the developer immediately before developing, the dissolution rate of the resist layer 2 distributing from the surface of the resist layer 2 to the surface of the substrate 2 with respect to the developer in the exposure range 6a, is within a range of approximately 0.2 through 0.5 Å/sec and stays almost the same. Further, the dissolution rate of the resist layer 2 with respect to the developer distributing from the surface of the resist layer 2 to the surface of the substrate 1 in the non-exposure region 6b is within a range of approximately 900 through 1,500 Å/sec which shows little variation.

Accordingly, in the exposure region 6a, the dissolution rate of the resist layer 2 with respect to the developer is lowered and the dissolution rate of the resist layer 2 with respect to the developer distributing from the surface of the resist layer 2 to the surface of the substrate 1 stays approximately the same as in Example 1. Therefore, roundings of the surface portion of the resist pattern 8 (corresponding to the exposure region 6a of the resist layer 2) that has been preserved after being developed by the developer, are restrained, encroachments of the portions of the resist 2 contacting the substrate 1 are restrained, and further, the side walls are provided with approximately flat faces.

Further, there is a difference by four digits or more between the dissolution rate of the resist layer 2 in the non-exposure region 6b and the dissolution rate of the resist layer 2 in the exposure region 6a. Especially, the difference between the dissolution rates of the resist layer 2 of the exposure region 6a and the non-exposure region 6b on the side of the resist layer 2 contacting the substrate, is larger than the difference between the dissolution rates of the resist layer 2 of the exposure region 6a and the non-exposure region 6b on the surface portion of the resist layer 2. Therefore, the pattern can be formed in a good shape even if it is of 0.3 μm or less.

Further, in above Examples 1 and 2, the same exposure device, for instance, a KrF excimer stepper, (for instance, NSR2005EX8A made by Nippon Kogaku K.K.) is employed both in the total irradiation step shown in FIG. 2 and the selective irradiation step shown in FIG. 4. The KrF excimer laser beam 5 is irradiated on the resist layer 2 preferably in a range of 10 through 50 mJ/cm². The opaque reticle 4 is used in the total face irradiation step shown in FIG. 2, and the effective exposure beam amount applied on the resist layer 2 is in a range of 1 through 50%, preferably 5 through 15% of the effective exposure beam amount applied on the exposure region 6a of the resist layer 2 in the selective irradiation step shown in FIG. 4. However, the exposure device is not restricted to the KrF excimer stepper and may be an exposure device for irradiating an ArF excimer laser beam, or an exposure device using a mercury lamp for irradiating an ultraviolet ray such as g line beam or i line beam. In short, the same effect is achieved by rendering the effective exposure beam amount applied on the resist layer 2 in the total face irradiation step shown in FIG. 2 is in the range of 1 through 50%, preferably 5 through 15% of the effective exposure beam amount applied on the exposure region 6a of the resist layer 2 in the selective irradiation step shown in FIG. 4, by using the same exposure device.

When an exposure device irradiating the ArF excimer laser beam is employed, the KrF excimer laser beam may be irradiated under the same condition as in the KrF excimer stepper. When an exposure device using a mercury lamp irradiating an ultraviolet ray such as g line beam or i line beam, in the total face irradiation step shown in FIG. 2, the irradiation may be performed by irradiating an ultraviolet ray such as g line beam or i line beam by a mercury lamp for an irradiation time period of 50 through 200 msec by using the opaque reticle 4 having the light transmittance of 1 through 50%, preferably 5 through 15%, whereas in the selective irradiation step shown in FIG. 4, the irradiation may be performed by irradiating an ultraviolet ray such as g line beam or i line beam by a mercury lamp for an irradiation time period of 50 through 1,000 msec, preferably 50 through 200 msec.

Further, with respect to the resist in the above Examples 1 and 2, the resist A and the resist B having different contents of the crosslinking agent are shown, however, the invention is not restricted to these resists. The resist may include hexamethoxymethylmelamine as the crosslinking agent by 10 through 50 wt %, preferably 20 through 40 wt % and 1,2,3,4-tetrabromobutane as the acid generating agent by 0.5 through 20 wt %, preferably 3 through 15 wt %, on the basis of 100 wt % of poly-P-hydroxystyrene as the alkali-soluble base resin.

The resist having such a content is provided with the dissolution rate of the resist layer 2 which has been formed on the surface of the substrate 1 after the step shown in FIG. 1, with respect to the developer, of 1,000 Å/sec or more, preferably 3,000 Å/sec or more at the surface layer of the formed resist layer 2, the dissolution rate of the resist layer 2 at the exposure region 6a immediately before developing is in the range of approximately 0.1 through 0.5 Å/sec with little variation from the surface of the resist layer 2 to the surface of the substrate 1, and the dissolution rate with respect to the developer in the non-exposure region 6b is in the range of approximately 800 through 2,000 Å/sec with little variation from the surface of the resist layer 2 to the surface of the substrate 1, which achieves an effect similar to those in Example 1 or Example 2.

Further, although in Example 1 and Example 2, poly-P-hydroxystyrene was employed as the alkali-soluble base resin of the resist, the invention is not restricted to this resin and it may be a phenolic resin or a novolak resin. Although hexamethoxymethylmelamine was employed as the crosslinking agent, this invention is not restricted thereto, and it may be tetramethoxymethylol urea or dimethylol urea. Although 1,2,3,4-tetrabromobutane was employed as the acid generating agent, this invention is not restricted thereto and it may be tris(2,3-dibromopropyl)isocyanurate, 2,3-dibromosulfolane, triphenylsulfonium triflate or the like. Although methyl 3-methoxypropionate is employed as the solvent, this invention is not restricted thereto, and may be propylene glycol monomethyl ether acetate, diethylene glycol dimethyl ether or the like. In short, the same effect is achieved by "a negative type resist which is slightly soluble or insoluble to a developer when a chemical change is caused in a substance that has been generated by receiving a radiation such as a light beam, an electron beam or the like, by baking".

Moreover, although in Example 1 and Example 2, the resist is "a negative type resist which is slightly soluble to a developer when a chemical change is caused in a substance that has been generated by receiving a radiation, by baking", the resist may be "a negative type resist which is slightly soluble or insoluble to a developer when a chemical change is caused to a substance by receiving a radiation such as a light beam, an electron beam or the like", using polyhydroxystyrene or a novolak resin or the like as an alkali-soluble base resin of the resist, 4,4'-diazide-3,3'-dimethoxybiphenyl or the like as a crosslinking agent.

EXAMPLE 3

FIG. 11 through FIG. 17 show Example 3 of this invention, and an explanation will be given of a method of forming a resist pattern concerning Example 3 in reference to FIG. 11 through FIG. 17 as follows.

Figure 11:
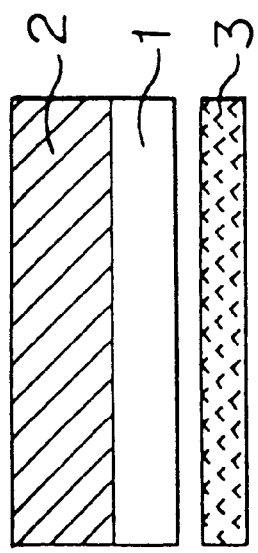
FIG. 11 is a partial sectional view showing Example 3 of this invention in the order of steps.

Firstly, the resist A which is the same as the resist A employed in Example 1, is spincoated on the surface of the substrate 1 as shown in FIG. 11. The substrate 1 spincoated with the resist A is prebaked on the hot plate 3 at 100° C. for 70 seconds, thereby forming the resist layer 2 on the surface of the substrate 1.

As the condition of spincoating, the spincoating was carried out such that the film thickness of the resist layer 2 became 1 $\mu$m.

At this instance, the dissolution rate of the resist layer 2 which had been formed on the surface of the substrate 1, with respect to a developer, for instance, an aqueous solution of 1.23 wt % of tetramethylammonium hydroxide (for instance, NMD-3 made by Tokyo Chemicals Co.) was 3,500 Å/sec at the surface layer of the formed resist layer 2.

The developer of the resist layer 2 is not restricted to this Example and may be another developer so far as it is an alkaline aqueous solution.

Figure 12:
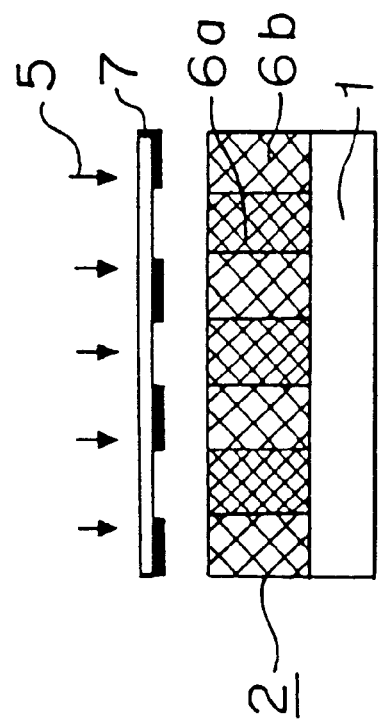
FIG. 12 is a partial sectional view showing Example 3 of this invention in the order of steps.

Next, as shown in FIG. 12, an exposure device, for instance, a KrF excimer stepper (for instance, NSR2005EX8A made by Nippon Kogaku K.K.) is employed, the reticle 7 which has been formed with a desired pattern similar to that in Example 1, is disposed on the surface of the resist layer 2, the KrF excimer laser beam 5 having a wavelength of 248 nm is irradiated from above the reticle 7 in a range of 5 through 100 mJ/cm$^2$, preferably 10 through 50 mJ/cm$^2$, wherein the excimer laser beam 5 is selectively irradiated on the surface of the resist layer through the reticle 7, thereby forming an image on the resist layer 2. Accordingly, the resist layer 2 is divided into the exposure region 6a and the non-exposure region 6b based on the pattern which has been formed on the reticle 7.

Figure 13:
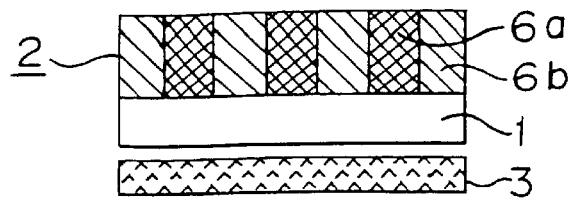
FIG. 13 is a partial sectional view showing Example 3 of this invention in the order of steps.

As shown in FIG. 7(b), an acid is generated from an acid generating agent in the exposure region 6a of the resist layer 2. The non-exposure region 6b of the resist layer 2 is in a state as shown by FIG. 7(a). Thereafter, as shown in FIG. 13, the baking operation is performed with respect to the substrate 1 having the resist layer 2 comprising the exposure region 6a and the non-exposure region 6b on the hot plate 3 that is the heating means, at 100° C. for 90 seconds. Through this baking operation, in the exposure region 6a of the resist layer 2, the acid generated from the acid generating agent operates as a catalyst, a crosslinking reaction is caused between the crosslinking agent and the base resin, and the exposure region 6a of the resist layer 2 is hardened, as shown in FIG. 7(c). This baking is called the post exposure baking (PEB). Further, in the non-exposure region 6b of the resist layer 2, no crosslinking reaction is caused between the crosslinking agent and the base resin since no acid has been generated from the acid generating agent.

Further, by this baking operation, the thickness of the resist layer 2 which has been formed on the substrate 1, is more or less reduced in comparison with the thickness before baking.

Figure 14:
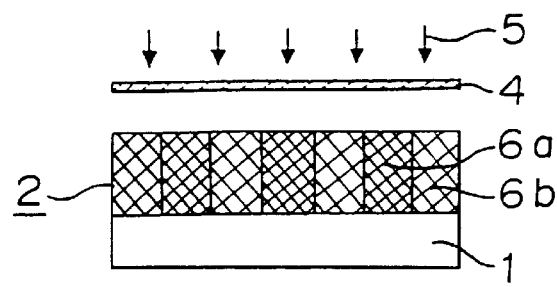
FIG. 14 is a partial sectional view showing Example 3 of this invention in the order of steps.

Next, as shown in FIG. 14, the exposure device the same as that employed in the selective irradiation step shown in FIG. 12, is employed, the opaque reticle 4 having the light transmittance of 10% similar to that used in Example 1, is disposed above the surface of the resist layer 2 that has been selectively exposed, and the KrF excimer laser beam 5 having the wavelength of 248 nm is irradiated from above the opaque reticle 4 in a range of 10 through 50 mJ/cm$^2$, wherein the excimer laser beam 5 is irradiated on the total face of the resist layer 2 through the opaque reticle 4. Further, although this Example employs the opaque reticle 4 having the light transmittance of 10%, the light transmittance may be in a range of 1 through 50%, preferably 5 through 15%.

Figure 15:
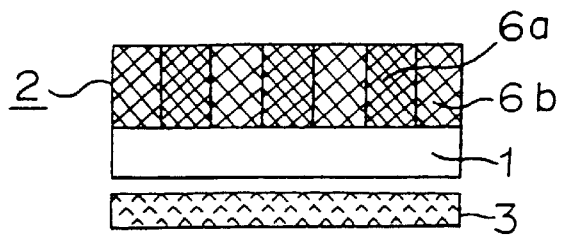
FIG. 15 is a partial sectional view showing Example 3 of this invention in the order of steps.

Further, as shown in FIG. 15, the baking is performed by disposing the substrate 1 of which total surface of the resist layer 2 has been irradiated with the excimer laser beam, on the hot plate 3 that is the heating means, at 100° C. for 90 seconds.

Figure 17:
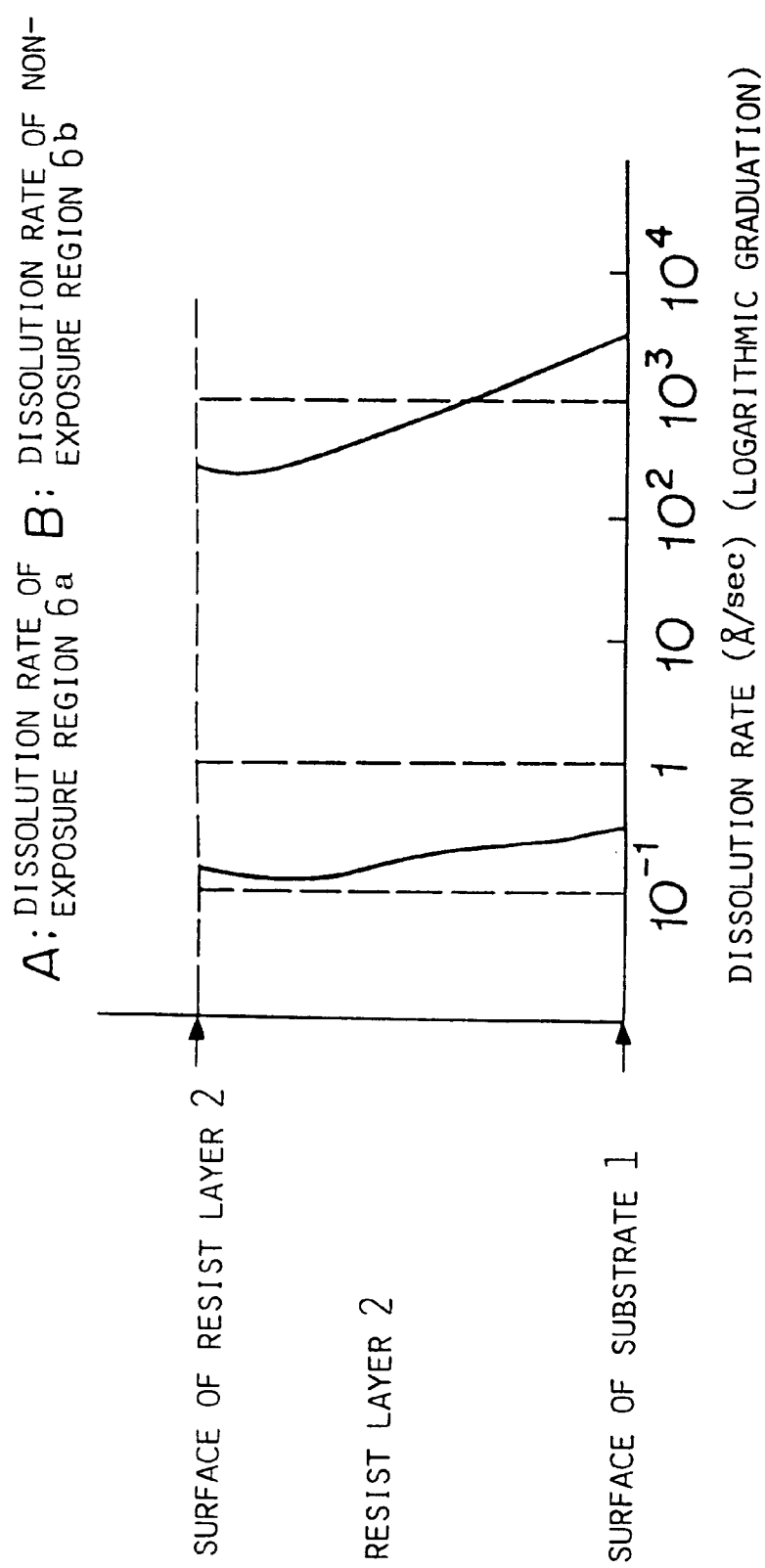
FIG. 17 is a diagram showing dissolution rates of a resist layer 2 with respect to a developer in an exposure region and a non-exposure region in Example 3 of this invention.

A result as shown in FIG. 17 was obtained by measuring the dissolution rate of the resist layer 2 comprising the exposure region 6a and the non-exposure region 6b formed as above with respect to the developer immediately before developing. In FIG. 17, line A designates the dissolution rate of the resist layer 2 distributing from the surface of the resist layer 2 to the surface of the substrate 1 in the exposure region 6a, whereas line B designates the dissolution rate of the resist layer 2 with respect to the developer distributing from the surface of the resist layer 2 to the surface of the substrate 1 in the non-exposure region 6b.

Figure 16:
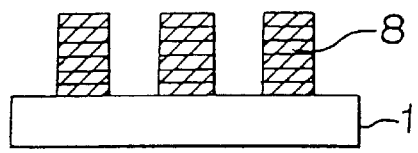
FIG. 16 is a partial sectional view showing Example 3 of this invention in the order of steps.

The developing is performed by the spray-paddle system for 100 seconds using the above developer, or "NMD-3 made by Tokyo Ohka Kogyo Co., LTD", or an aqueous solution of 1.23 wt % of tetramethylammonium hydroxide, thereby obtaining the resist pattern 8 as shown in FIG. 16.

Measurement was performed on the resist pattern 8 obtained as above with respect to the sectional shape of 0.3 $\mu$m line and space pattern, the sensitivity of 0.3 $\mu$m line and space pattern (exposure beam amount in finishing the resist pattern as specified by mask dimensions), the limit resolution of line and space pattern, and the resolution depth of focus of 0.3 $\mu$m line and space pattern, whereby a result as shown in FIG. 9 is obtained.

With respect to the sectional shape of the resist pattern 8, although there are more or less roundings of the surface portion, there are almost no encroachments in the portions of the resist contacting the substrate 1, and moreover, the side walls are in an approximately rectangular shape having faces orthogonal to the approximately flat substrate 1. The sensitivity of 0.3 $\mu$m line and space pattern is 55 mJ/cm$^2$, and the limit resolution of line and space pattern is 0.200 $\mu$m which is smaller than those of Comparative Examples, mentioned later. Therefore, a sufficient resolution is provided and the function is improved. The resolution depth of focus of 0.3 $\mu$m line and space pattern is 1.5 $\mu$m which is larger than those in Comparative Examples, mentioned later. Therefore, a broad range of depth of focus is provided and the function is improved.

The reason of obtaining the resist pattern 8 having the high resolution, the broad focus allowance and the good shape is considered to be as follows.

As is apparent from FIG. 17 showing the dissolution rate of the resist layer 2 with respect to the developer immediately before developing, the dissolution rate of the resist layer 2 with respect to the developer distributing from the surface of the resist layer 2 to the surface of the substrate 1 in the exposure region 6a, is within the range of approximately 0.1 through 0.5 Å/sec which stays approximately the same, whereas the dissolution rate of the resist layer 2 with respect to the developer distributing from the surface of the resist layer 2 to the surface of the substrate 1 in the non-exposure exposure region 6b, is provided with little variation and within the range of approximately 800 through 2,000 Å/sec.

Accordingly, in the exposure region 6a of the resist layer 2, the effectively absorbed exposure beam amount is increased by the twice irradiation steps of the selective irradiation step shown in FIG. 12 and the total face irradiation step shown in FIG. 14, the hardening reaction is accelerated, the dissolution rate with respect to the developer is lowered, and the dissolution rate of the resist layer 2 with respect to the developer stays approximately the same from the surface of the resist layer 2 to the surface of the substrate 1. The encroachment of the portions of the resist pattern 8 which has been preserved after development by the developer (corresponding to the exposure region 6a of the resist layer 2) contacting the substrate 1, is restrained, and the side walls are provided with approximately flat vertical faces.

Further, the dissolution rate of the resist with respect to the developer distributing from the surface of the resist to the surface of the substrate 1 in the exposure region 6a of the resist layer 2 because of the following reason. The baking step of the resist layer 2 shown in FIG. 13 is performed between the selective irradiation step of the excimer laser beam 5 shown in FIG. 12 and the total irradiation step of the excimer laser beam 5 shown in FIG. 14, and therefore, the thickness of the resist layer 2 after the selective irradiation step shown in FIG. 12 is different from that after the total face irradiation step shown in FIG. 14. Accordingly, a standing wave of the excimer laser beam 5 in the selective irradiation step shown in FIG. 12 at the exposure region 6a of the resist layer 2, functions to cancel with a standing wave of the excimer laser beam in the total face irradiation step shown in FIG. 14, whereby the dissolution rate of the resist layer 2 stays the same in the resist from the surface of the resist layer 2 to the surface of the substrate 1.

Further, in the non-exposure region 6b of the resist layer 2, the light absorption amount of the excimer laser beam 5 in the total face irradiation step shown in FIG. 14 is increased in the portions of the resist proximate to the surface and the portions of the resist are easy to harden. Therefore, the dissolution rate of the resist with respect to the developer is lowered to approximately 800 Å/sec from the dissolution rate of 3,500 Å/sec with respect to the developer before the irradiation of the excimer laser 5. Although the hardening reaction is caused on the topmost surface through the excimer laser beam 5 in the total face irradiation step shown in FIG. 14, the lowering of the dissolution rate at the topmost surface is smaller than the lowering of the dissolution rate at the portions of the resist proximate to the surface, due to the evaporation of the acid that has been generated by the excimer laser beam 5 or the reaction thereof with basic substances in the atmosphere. Further, the dissolution rate of the portions of the resist contacting the substrate 1 is mostly enhanced. The dissolution rate of the resist layer 2 with respect to the developer distributing from the surface of the resist layer 2 to the surface of the substrate 1 is provided with little variation and within the range of approximately 800 through 2,000 Å/sec. Further, the difference between the dissolution rates of the resist layer 2 of the exposure region 6a and the non-exposure region 6b on the side of the portions of the resist contacting the substrate 1, is larger than the difference between the dissolution rates of the resist layer 2 of the exposure region 6a and the non-exposure region 6b at the surface portion of the resist layer 2.

Accordingly, there is a difference by four digits or more between the dissolution rate of the resist layer 2 at the non-exposure region 6b and the dissolution rate of the resist layer 2 at the exposure region 6a throughout the resist from the surface of the resist layer 2 to the surface of the substrate 1, the resist pattern can be formed in a good shape even if it is of 0.3 μm or less, and the difference of the dissolution rates therebetween at the portions of the resist contacting the substrate 1 is larger than the difference of the dissolution rates therebetween on the surface portion of the resist layer 2. Therefore, the high resolution can be achieved.

Further, although in Example 3, for instance, the KrF excimer stepper is employed both in the selective irradiation step shown in FIG. 12 and the total face irradiation step shown in FIG. 14, it may be an exposure device irradiating an ArF excimer laser beam, or may be an exposure device using a mercury lamp irradiating an ultraviolet ray such as g line beam or i line beam. In short, the same effect is achieved when the effective exposure beam amount applied on the resist layer 2 in the total face irradiation step shown in FIG. 14, is in a range of 1 through 50%, preferably 5 through 15% of the effective exposure beam amount applied on the exposure region 6a of the resist layer 2 in the selective irradiation step shown in FIG. 12.

When an exposure device irradiating the ArF excimer laser beam is employed, the ArF excimer laser beam may be irradiated under the same condition as in the KrF excimer stepper. When an exposure device using a mercury lamp irradiating an ultraviolet ray such as g line beam or i line beam, the ultraviolet ray such as g line beam or i line beam may be irradiated by a mercury lamp in the irradiation time period of 50 through 200 msec by using the opaque reticle 4, the light transmittance of which is in a range of 1 through 50%, preferably 5 through 15%, in the total face irradiation step shown in FIG. 14, and the ultraviolet ray such as g line beam or i line beam may be irradiated by a mercury lamp in the irradiation time period of 50 through 1,000 msec, preferably 50 through 200 msec in the selective irradiation step shown by FIG. 12.

Further, although the resist A is employed in Example 3, the resist B in Example 2 may be used. Further, the resist may include 10 through 50 wt %, preferably 20 through 40 wt % of hexamethoxymethylmelamine as the crosslinking agent and 0.5 through 20 wt %, preferably 3 through 15 wt % of 1,2,3,4-tetrabromobutane as the acid generating agent, on the basis of 100 wt % of poly-P-hydroxystyrene as the alkali-soluble base resin.

In the resist having such contents, after the step shown in FIG. 11, the dissolution rate of the resist layer 2 that has been formed on the surface of the substrate 1, with respect to the developer, is 1,000 Å/sec or more, preferably 3,000 Å/sec or more at the surface layer of the formed resist layer 2, the dissolution rate of the resist layer 2 at the exposure region 6a immediately before developing is provided with little variation and within a range of approximately 0.1 through 0.5 Å/sec distributing from the surface of the resist layer 2 to the surface of the substrate 1, whereas the dissolution rate with respect to the developer in the non-exposure region 6b is provided with little variation and within a range of approximately 800 through 2,000 Å/sec distributing from the surface of the resist layer 2 to the surface of the substrate 1, whereby an effect similar to that in Example 3 is achieved.

Further, although poly-P-hydroxystyrene is employed in Example 3 as an alkali-soluble base resin of the resist, this invention is not restricted to the resin, and it may be a phenolic resin, a novolak resin or the like. Although hexamethoxymethylmelamine is employed as the crosslinking agent, this invention is not restricted thereto, and it may be tetramethoxymethylol urea or dimethylol urea or the like. Although 1,2,3,4-tetrabromobutane is employed as the acid generating agent, this invention is not restricted thereto, and it may be tris(2,3-dibromopropyl)isocyanurate, 2,3-dibromosulfolane, triphenylsulfonium triflate or the like. Although methyl 3-methoxypropionate is employed as the solvent, this invention is not restricted thereto, and it may be propylene glycol monomethyl ether acetate, diethylene glycol dimethyl ether or the like. In short, the same effect is achieved by "a negative type resist which is slightly soluble or insoluble to a developer when a chemical change is caused in a substance that has been generated by receiving a radiation such as a light beam, an electron beam or the like, by baking".

Further, although Example 3 employs "a negative type resist which is slightly soluble to a developer when a chemical change is caused in a substance that has been generated by receiving a radiation, by baking", as a resist, the resist may be "a negative type resist which is slightly soluble or insoluble to a developer by causing a chemical change by receiving a radiation such as a light beam, an electron beam or the like", using polyhydroxystyrene or a novolak resin or the like as the alkali-soluble base resin of the resist, and 4,4'diazide-3,3'-dimethoxybiphenyl or the like as the crosslinking agent.

EXAMPLE 4

FIG. 18 through FIG. 22 show Example 4 of this invention, and an explanation will be given of a method of forming a resist pattern with respect to Example 4 in reference to FIG. 18 through FIG. 22 as follows.

Figure 18:
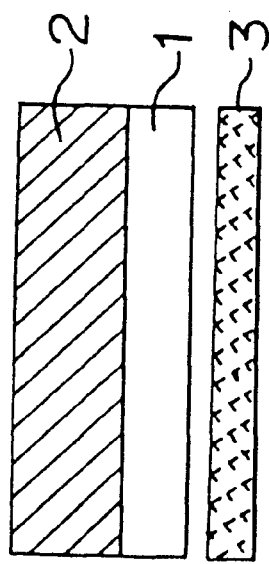
FIG. 18 is a partial sectional view showing Example 4 of this invention in the order of steps.

Firstly, as shown in FIG. 18, the resist A that is the same with the resist A employed in Example 1, is spincoated on the surface of the substrate 1, as shown in FIG. 18. The substrate 1 spincoated with the resist A is prebaked above the hot plate 3 that is the heating means, at 100° C. for 70 seconds.

As the condition of spincoating, the spincoating operation was performed such that the film thickness of the resist layer 2 after prebaking became 1 μm.

At this instance, the dissolution rate of the resist layer 2 that had been formed on the surface of the substrate 1, with respect to a developer, for instance, an aqueous solution of 1.23 wt % of tetramethylammonium hydroxide (for instance, NMD-3 made by Tokyo Ohka Kogyo Co., LTD), was 3,500 Å/sec at the surface layer of the formed resist layer 2.

Further, the developer for the resist layer 2 is not restricted to the above Example, and it may be any developer so far as it is an alkaline aqueous solution.

Figure 19:
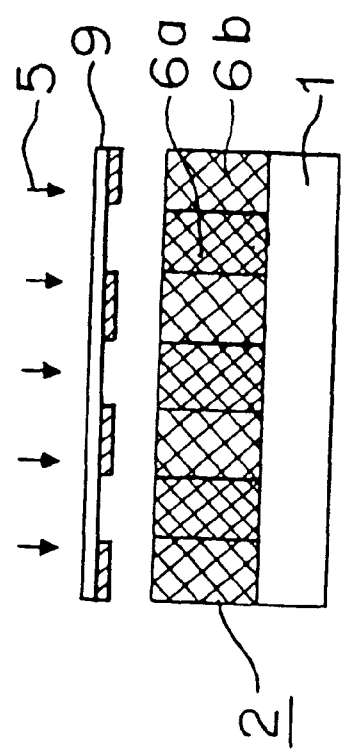
FIG. 19 is a partial sectional view showing Example 4 of this invention in the order of steps.

Next, as shown in FIG. 19, an exposure device, for instance, a KrF excimer stepper (for instance, NSR2005EX8A made by Nippon Kogaku K.K.) is used, the reticle 9 formed with a desired pattern wherein the light transmittance of the light transmitting region is 100% and the light transmittance of the light shielding layer is 10%, is disposed above the surface of the resist layer 2, the KrF excimer laser beam 5 having the wavelength of 248 nm is irradiated from above the reticle 9, in a range of 5 through 100 mJ/cm$^2$, preferably 10 through 50 mJ/cm$^2$, whereby the excimer laser 5 is irradiated on the surface of the resist layer 2 through the reticle 9, thereby forming an image on the resist layer 2. Accordingly, the resist layer 2 is divided into the exposure region 6a and the non-exposure region 6b based on a pattern formed on the reticle 7, and the non-exposure region 6b is irradiated with the exposure beam amount that is 10% of the exposure beam amount irradiated on the exposure region 6a. At this instance, as shown in FIG. 7(b), an acid is generated from an acid generating agent in the exposure region 6a of the resist layer 2.

The reticle 9 is formed with a light shielding layer (the light transmittance is 10%) comprising a desired pattern or a light shielding layer corresponding to the portion of the resist to be removed and a light transmitting region corresponding to the portion of the resist to be preserved, on its face of a transparent substrate such as glass. The light shielding layer is formed by a film of chromium (Cr), molybdenum silicide (MoSi) or oxinitrides of these.

Although the light transmittance of the light shielding layer of the reticle 9 is 10%, it may be in a range of 1 through 20%, preferably 3 through 15%. Further, the light shielding layer may be a half tone mask employed in the phase shift method which is applicable to a positive type resist.

Figure 20:
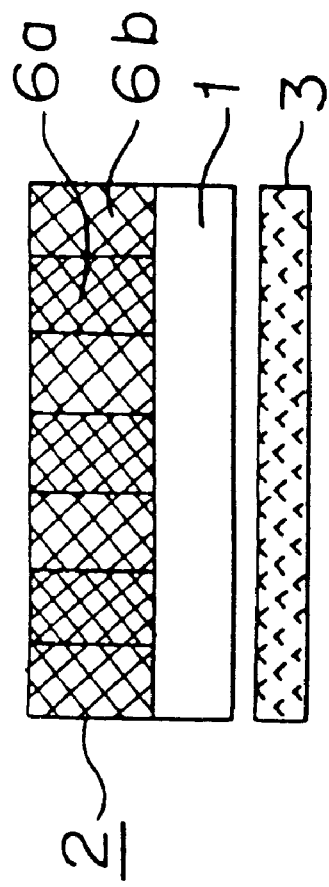
FIG. 20 is a partial sectional view showing Example 4 of this invention in the order of steps.

Thereafter, as shown in FIG. 20, a baking operation is performed with respect to the substrate 1 having the resist layer 2 comprising the exposure region 6a and the non-exposure region 6b on the hot plate 3 that is the heating means, at 100° C. for 90 seconds. Through this baking operation, in the exposure region 6a of the resist layer 2, an acid generated from an acid generating agent operates as a catalyst as shown in FIG. 7(c), a crosslinking reaction is caused between the crosslinking agent and the base resin, whereby the exposure region 6a of the resist layer 2 is hardened. The baking is called the post exposure baking (PEB).

Figure 22:
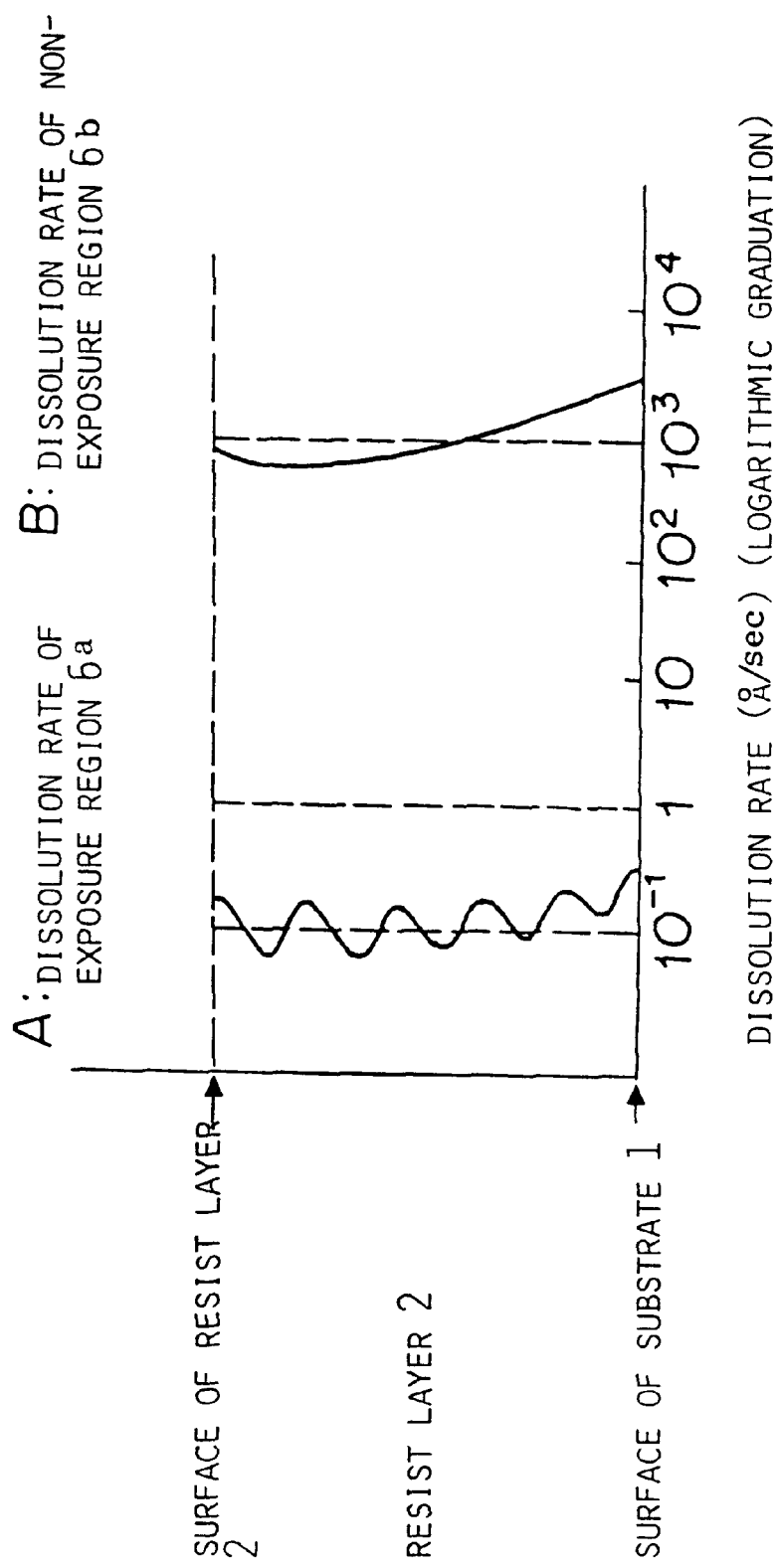
FIG. 22 is a diagram showing dissolution rates of a resist layer 2 with respect to a developer in an exposure region and a non-exposure region before development in Example 4 of this invention.

A result as shown in FIG. 22 is obtained by measuring the dissolution rate of the resist layer 2 comprising the exposure region 6a and the non-exposure region 6b formed as above, with respect to the developer immediately before developing. In FIG. 22, line A designates the distribution of the dissolution rate of the resist layer 2 with respect to the developer from the surface of the resist layer 2 to the surface of the substrate 1 in the exposure region 6a, whereas line B designates the distribution of the dissolution rate of the resist layer 2 with respect to the developer from the surface of the resist layer 2 to the surface of the substrate 1 in the non-exposure region 6b.

Figure 21:
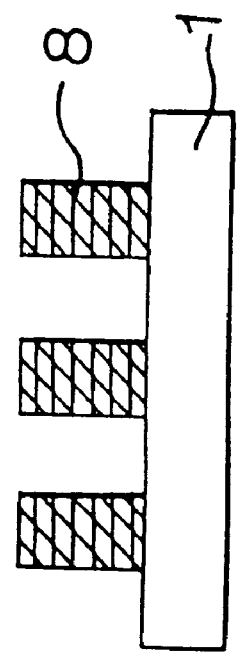
FIG. 21 is a partial sectional view showing Example 4 of this invention in the order of steps.

Further, the developing is performed by the spray-paddle system for 100 seconds by using the developer, or "NMD-3 made by Tokyo Ohka Kogyo Co., LTD " or an aqueous solution of 1.23 wt % of tetramethylammonium hydroxide, by which the resist pattern 8 as shown in FIG. 21 is provided.

A result as shown in FIG. 9 is provided with respect to the resist pattern 8 obtained as above, by measuring the sectional shape of 0.3 μm line and space pattern, the sensitivity of 0.3 μm line and space pattern (exposure beam amount for finishing the resist pattern as specified by mask dimensions), the limit resolution of line and space pattern and the resolution depth of focus of 0.3 μm line and space pattern.

In the sectional shape of the resist pattern 8, there are almost no roundings at the surface portion and encroachments at the portions of the resist contacting the substrate 1, and it is almost in a rectangular shape although there is more or less waviness on the side walls. The sensitivity of 0.3 μm line and space pattern is 45 mJ/cm$^2$ and the limit resolution of line and space pattern is 0.150 which are smaller than those of Comparative Examples, mentioned later. Therefore, a sufficient resolution is provided and the function is improved. The resolution depth of focus of 0.3 μm line and space pattern is 2.1 μm which is larger than those in Comparative Examples, mentioned later. Therefore, a broad range of depth of focus is provided and the function is improved.

The reason of obtaining the resist pattern 8 having the high resolution, the broad focus allowance and the good shape is considered to be as follows.

As is apparent from FIG. 22 showing the dissolution rate of the resist layer 2 with respect to the developer immediately before developing, the dissolution rate of the resist layer 2 distributing from the surface of the resist layer 2 to the surface of the substrate 1 in the exposure region 6a is within a range of approximately 0.09 through 0.2 Å/sec, and the dissolution rate of the resist layer 2 distributing from the surface of the resist layer 2 to the surface of the substrate 1 in the non-exposure region 6b, is provided with little variation and within a range of approximately 900 through 2,000 Å/sec.

Accordingly, the dissolution rate of the resist layer 2 with respect to the developer in the exposure region 6a is lowered, by which roundings of the surface portion of the resist pattern 8 that has been preserved after developing by the developer (corresponding to the exposure region 6a of the resist layer 2) and encroachments of the portions of the resist contacting the substrate 1, are restrained.

Further, with respect to the non-exposure region 6b of the resist layer 2, the portions of the resist proximate to the surface are applied with a large amount of light absorption of the excimer laser beam 5 in the irradiation step as shown in FIG. 19, and the portions are easy to harden. The dissolution rate with respect to the developer is lowered from 3,500 Å/sec before irradiating the excimer laser beam 5 to approximately 900 Å/sec. Although the hardening reaction is caused on the topmost surface by the excimer laser beam 5 in the irradiation step shown in FIG. 19, the lowering of the dissolution rate is smaller than the lowering the dissolution rate of the portions of the resin proximate to the surface due to evaporation of the acid that has been generated by the excimer laser beam 5 or a reaction thereof with basic substances in the atmosphere. Further, the dissolution rate with respect to the developer at the portions of the resist contacting the substrate 1 is mostly enhanced. The dissolution rate of the resist layer 2 with respect to the developer distributing from the surface of the resist layer 2 to the surface of the substrate 1 is provided with little variation and within the range of approximately 900 through 2,000 Å/sec. Further, the difference between the dissolution rates of the resist layer 2 of the exposure region 6a and the non-exposure region 6b on the side of the portions of the resist contacting the substrate 1, is larger than the difference of the dissolution rates of the resist layer 2 between the exposure region 6a and the non-exposure region 6b on the surface portion of the resist layer 2.

Accordingly, there is a difference by four digits or more between the dissolution rate of the resist layer 2 in the non-exposure region 6b and the dissolution rate of the resist layer 2 in the exposure region 6a throughout the resin from the surface of the resist layer 2 to the surface of the substrate 1. The resist pattern can be formed in a good shape even if it is a pattern of 0.3 μm or less. The difference of the dissolution rates at the portions of the resist contacting the substrate 1, is larger than the difference of the dissolution rates on the surface portion of the resist layer 2. Therefore, the high resolution can be achieved.

Although the irradiation step shown in FIG. 19, uses, for instance, the KrF excimer stepper, in Example 4, it may be replaced by an exposure device irradiating an ArF excimer laser beam, or an exposure device using a mercury lamp irradiating an ultraviolet ray such as g line beam or i line beam. In short, the same effect is achieved when the effective exposure beam amount applied on the non-exposure region 6b of the resist layer 2 which is irradiated by transmitting through the light shielding layer, is within a range of 1 through 20%, preferably 3 through 15% of the effective exposure beam amount to the exposure region 6a of the resist layer 2 which is irradiated by transmitting through the light transmitting region, by using the reticle 9.

When the exposure device irradiating the ArF excimer laser beam is employed, the ArF excimer laser beam may be irradiated under the same condition as in the KrF excimer stepper. When the exposure device using the mercury lamp irradiating an ultraviolet ray such as g line beam or i line beam, is employed, an ultraviolet ray such as g line beam or i line beam may be irradiated by the mercury lamp in the irradiation time period of 100 through 300 msec by using the reticle 9 having the light transmittance of the light shielding layer in the range of 1 through 20%, preferably 3 through 15%, in the irradiation step shown in FIG. 19.

Although in Example 4, the resist A is employed, the resist B in Example 2 may be used. The resist may include 10 through 50 wt %, preferably 20 through 40 wt % of hexamethoxymethylmelamine as the crosslinking agent and 0.5 through 20 wt %, preferably 5 through 15 wt % of 1,2,3,4-tetrabromobutane as the acid generating agent, on the basis of 100 wt % of poly-P-hydroxymethylene as the alkali-soluble base resin.

In the resist having such contents, the dissolution rate of the resist 2 that has been formed on the surface of the substrate 1 after the step shown in FIG. 18, with respect to the developer, is 1,000 Å/sec or more, preferably 3,000 Å/sec or more at the surface layer of the formed resist layer 2. The dissolution rate of the resist layer 2 in the exposure region 6a immediately before developing is within a range of approximately 0.09 through 0.2 Å/sec distributing from the surface of the resist layer 2 to the surface of the substrate 1, whereas the dissolution rate with respect to the developer in the non-exposure region 6b, is provided with little variation and within a range of approximately 900 through 2,000 Å/sec distributing from the surface of the resist layer 2 to the surface of the substrate 1. Therefore, an effect the same as Example 4 is achieved.

Although Example 4 employs poly-P-hydroxystyrene as the alkali-soluble base resin of the resist, this invention is not restricted thereto, and it may be a phenolic resin, a novolak resin or the like. Although hexamethoxymethylmelamine is employed as the crosslinking agent, the invention is not restricted thereto, and it may be tetramethoxymethylol urea, dimethylol urea or the like. Although 1,2,3,4-tetrabromobutane is employed as the acid generating agent, the invention is not restricted thereto, and it may be tris(2, 3-dibromopropyl-isocyanurate, 2,3-dibromosulfolane, triphenylsulfonium triflate or the like. Although methyl 3-methoxypropionate is employed as the solvent, the invention is not restricted thereto, and it may be propylene glycol monomethyl ether acetate, diethylene glycol dimethyl ether or the like. In short, the same effect is achieved when the resist is "a negative type resist which is slightly soluble or insoluble to a developer when a chemical change is caused in a substance which has been generated by receiving a radiation beam such as a light beam, an electron beam or the like, by baking".

Furthermore, although Example 4 employs as a resist, "a negative type resist which is slightly soluble to a developer when a chemical change is caused in a substance which has been generated by receiving a radiation, by baking", the resist may be a negative type resist which is slightly soluble or insoluble to a developer by causing a chemical change by receiving a radiation such as a light beam, an electron beam or the like", using polyhydroxystyrene, a novolak resin or the like as the alkali-soluble base resin of the resist, and 4,4'-diazide-3,3'-dimethoxybiphenyl or the like as the crosslinking agent.

The resolution of the resist pattern is further enhanced in Example 4, when the reticle 9 uses a half tone mask wherein the light shielding layer is a phase shifter layer for transmitting a radiation having a first phase that is different from a second phase of a radiation for transmitting through the light transmitting region, wherein the first phase is different from the second phase, for instance, by 180° C.

Next, an explanation will be given of Comparative Examples having the resist A (Comparative Example 1) and the resist B (Comparative Example 2) wherein resist patterns are formed by a conventional method of forming a resist pattern as shown in FIG. 23 through FIG. 26, to compare these with the above Examples.

COMPARATIVE EXAMPLE 1

Figure 23:
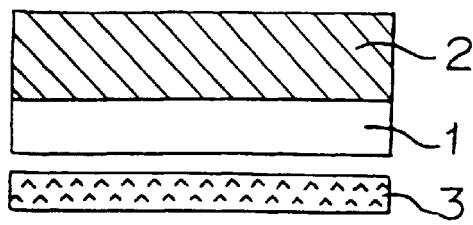
FIG. 23 is a partial sectional diagram showing Comparative Example 1 of this invention in the order of steps.

Firstly, as shown in FIG. 23, the resist A which has been employed in Example 1, is spincoated on the surface of the substrate 1. The substrate 1 spincoated with the resist A is prebaked above the hot plate 3 that is the heating means, at 100° C. for 70 seconds, by which the resist layer 2 is formed on the surface of the substrate 1.

As the spincoating condition, the spincoating was performed such that the film thickness of the resist layer 2 became 1 μm after prebaking.

At this instance, the dissolution rate of the resist layer 2 which had been formed on the surface of the substrate 1, with respect to a developer for the resist layer 2, for instance, an aqueous solution of 1.23 wt % of tetramethylammonium hydroxide (for instance, NMD-3 made by Tokyo Ohka Kogyo Co., LTD) was 3,500 Å/sec at the surface layer of the formed resist layer 2.

Figure 24:
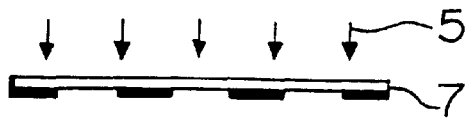
FIG. 24 is a partial sectional diagram showing Comparative Example 1 of this invention in the order of steps.
Figure 24:
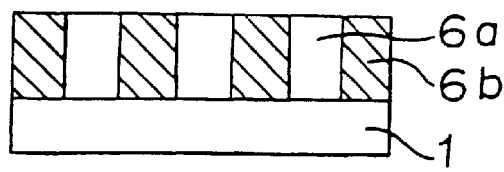

Next, as shown in FIG. 24, an exposure device, for instance, a KrF excimer stepper (for instance, NSR2005EX8A made by Nippon Kogaku K.K.) is employed, the reticle 7 formed with a desired pattern similar to that employed in the selective radiation step of Example 1 shown in FIG. 4, is disposed above the surface of the resist layer 2, and the KrF excimer laser beam 5 having the wavelength of 248 nm is irradiated from above the reticle 7 in a range of 5 through 100 mJ/cm², wherein the excimer laser beam 5 is selectively irradiated on the surface of the resist layer 2 through the reticle 7, by which an image is formed on the resist layer 2. The resist layer 2 is divided into the exposure region 6a and the non-exposure region 6b based on the pattern formed on the reticle 7.

Figure 25:
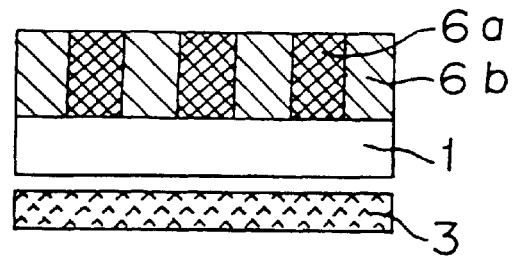
FIG. 25 is a partial sectional diagram showing Comparative Example 1 of this invention in the order of steps.

Thereafter, as shown in FIG. 25, the baking operation is performed with respect to the substrate having the resist layer 2 comprising the exposure region 6a and the non-exposure region 6b on the hot plate 3 that is the heating means, at 100° C. for 90 seconds.

Figure 27:
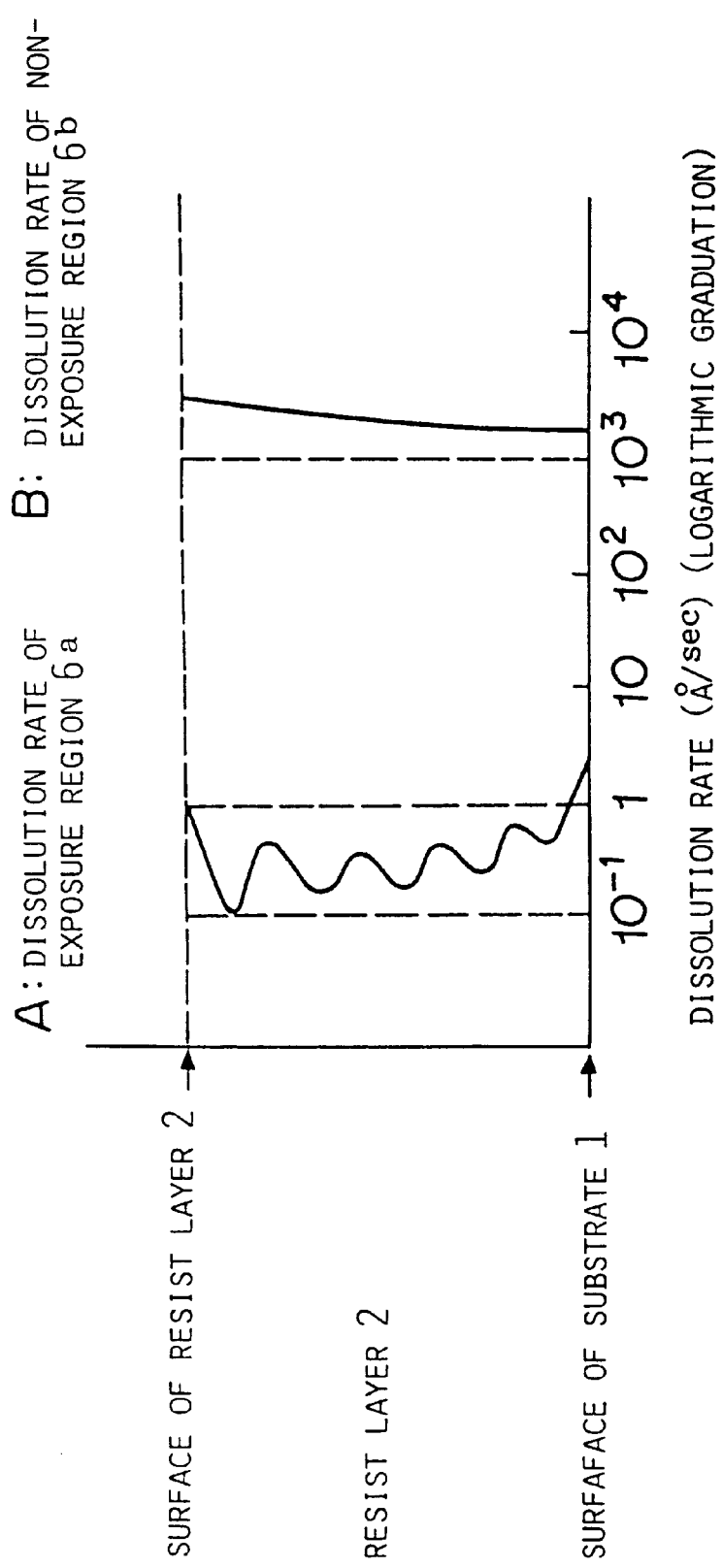
FIG. 27 is a diagram showing dissolution rates of the resist layer 2 with respect to a developer in an exposure region and a non-exposure region before development in Comparative Example 1 of this invention.

A result as shown in FIG. 27 is obtained by measuring the dissolution rate of the resist layer 2 comprising the exposure region 6a and the non-exposure region 6b formed as above with respect to the developer immediately before developing. In FIG. 27, line A designates the distribution of the dissolution rate of the resist layer 2 from the surface of the resist layer 2 to the surface of the substrate 1 in the exposure region 6a, whereas line B designates the distribution of the dissolution rate of the resist layer 2 with respect to the developer from the surface of the resist layer 2 to the surface of the substrate 1 in the non-exposure region 6b.

As is apparent from FIG. 27, as the dissolution rate of the resist layer 2 at this instance with respect to the developer immediately before developing, the dissolution rate with respect to the developer in the exposure region 6a, is wavily distributed within a range of approximately 0.1 through 5 Å/sec from the surface of the resist layer 2 to the surface of the substrate 1, whereas the dissolution rate with respect to the developer in the non-exposure region 6b, stays approximately the same with the dissolution rate of 3,500 Å/sec at the surface layer of the resist layer 2 after the step shown in FIG. 23. The dissolution rate varies from the surface of the resist layer 2 to the surface of the substrate 1 within a range of approximately 1,500 through 3,500 Å/sec.

Figure 26:
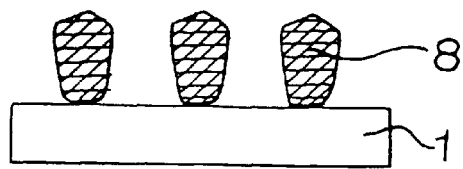
FIG. 26 is a partial sectional diagram showing Comparative Example 1 of this invention in the order of steps.

Further, the developing operation is performed through the spray-paddle system for 100 seconds by using the developer, by which the resist pattern 8 shown in FIG. 26 is provided.

A result as shown in FIG. 9 is obtained in the resist pattern 8 provided as above, by measuring the sectional shape of 0.3 μm line and space pattern, the sensitivity of 0.3 μm line and space pattern (exposure beam amount in finishing resist pattern as specified by mask dimensions), the limit resolution of line and space pattern, and the resolution depth of focus of 0.3 μm line and space pattern.

The sectional shape of the resist pattern 8 is in an elliptic shape wherein roundings are caused on the surface portion and encroachments are caused at the portions of the resist contacting the substrate 1. The sensitivity of 0.3 μm line and space pattern is 70 mJ/cm² and the limit resolution of line and space pattern is 0.300 μm which are large values. The resolution depth of focus of 0.3 μm line and space pattern is 0 μm which is the smallest value.

COMPARATIVE EXAMPLE 2

In Comparative Example 2, only the composition of the resist is different from that in Comparative Example 1, and the resist B in Example 2 is employed in place of the resist A.

Figure 28:
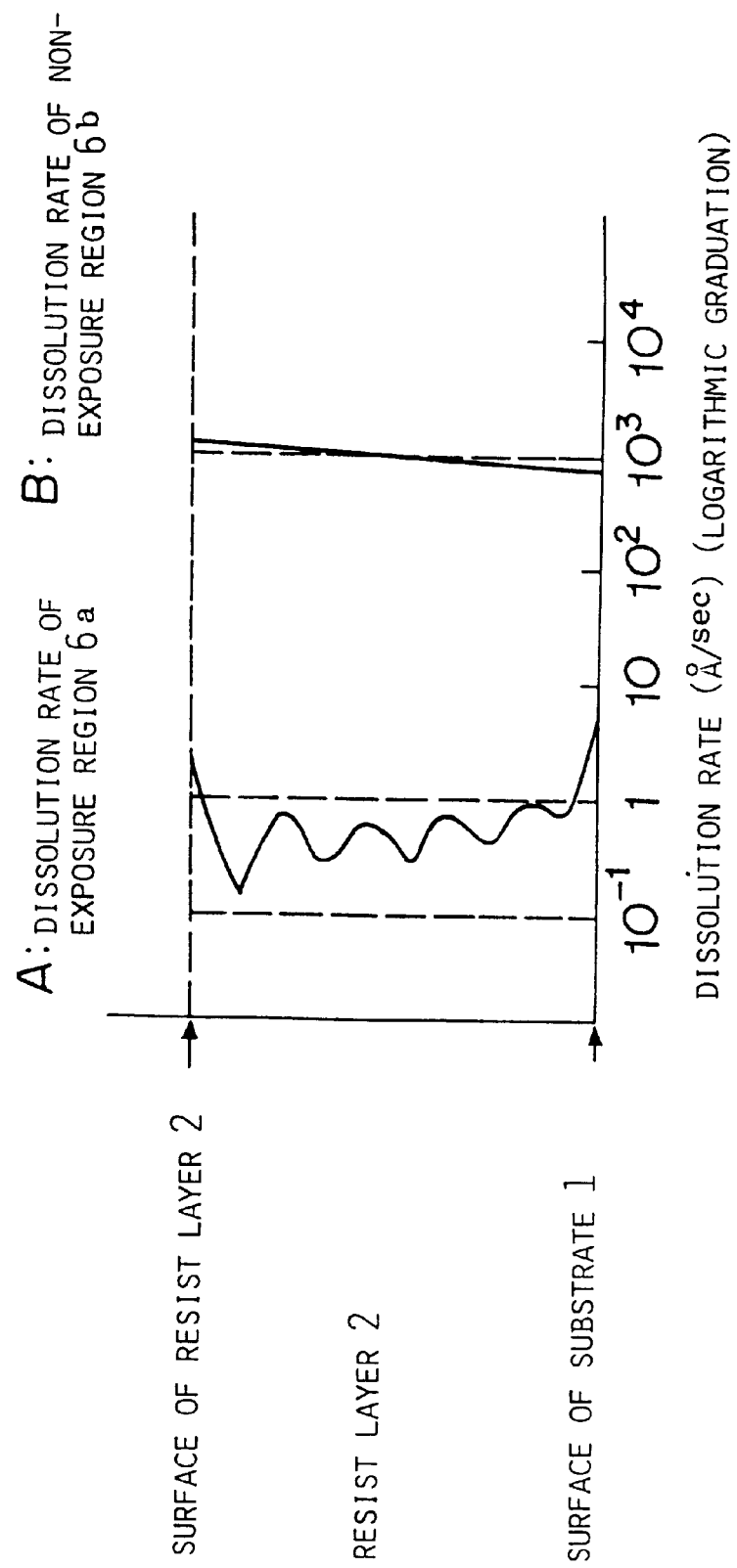
FIG. 28 is a diagram showing dissolution rates of a resist layer 2 with respect to a developer in an exposure region and in a non-exposure region before development in Comparative Example 2 of this invention.

In Comparative Example 2 in which the resist pattern 8 is formed in accordance with the order of steps as shown by FIG. 23 through FIG. 26 similar to Comparative Example 1, after the step shown by FIG. 23, the dissolution rate of the resist layer 2 with respect to the developer which has been formed on the surface of the substrate 1, is 1,500 Å/sec at the surface layer of the formed resist layer 2. A result as shown in FIG. 28 is obtained by measuring the dissolution rate of the resist layer 2 comprising the exposure region 6a and the non-exposure region 6b with respect to the developer immediately before developing, after the step shown in FIG. 25. In FIG. 28, line A designates the distribution of the dissolution rate of the resist layer 2 with respect to the developer from the surface of the resist layer 2 to the surface of the substrate 1 in the exposure region 6a, whereas line B designates the distribution of the dissolution rate of the resist layer 2 with respect to the developer from the surface of the resist layer 2 to the surface of the substrate 1 in the non-exposure region 6b of the resist layer 2.

As is apparent from FIG. 28, as the dissolution rate of the resist layer 2 at this instance with respect to the developer immediately before developing, the dissolution rate with respect to the developer in the exposure region 6a is wavily distributed within a range of approximately 0.1 through 5

Å/sec, from the surface of the resist layer 2 to the surface of the substrate 1, whereas the dissolution rate with respect to the developer in the non-exposure region 6b on the surface of the resist layer 2, is approximately equal to the dissolution rate of 1,500 Å/sec at the surface layer of the resist layer 2 after the step shown in FIG. 23 and the dissolution rate is provided with little variation and within a range of approximately 950 through 1,500 Å/sec distribution from the surface of the resist layer 2 to the surface of the substrate 1.

A result as shown in FIG. 9 is obtained for the resist pattern 8 provided as above, by measuring the sectional shape of 0.3 μm line and space pattern, the sensitivity of 0.3 μm line and space pattern (exposure beam amount in finishing resist pattern as specified by mask dimensions), the limit resolution of line and space pattern and the resolution depth of focus of 0.3 μm line and space pattern.

As the sectional shape of the resist pattern 8, there are roundings on the surface portion and encroachments at the portions of the resin contacting the substrate 1, and the side walls are provided with a wavy shape. The sensitivity of 0.3 μm line and space pattern is 50 mJ/cm$^2$, and the limit resolution of line and space pattern is 0.250 μm which is a large value. The resolution depth of focus of 0.3 μm line and space pattern is 0.9 μm which is a small value.

As is apparent from FIG. 9, in contrast to the resist patterns in Comparative Example 1 and Comparative Example 2, those shown in Examples 1 through 4, are provided with high sensitivity, high resolution prevailing over a fine pattern and a broad range of depth of focus. The sectional shape of the resist pattern has advantages in which no roundings of the surface portion, and no encroachments of the portions of the resist contacting the substrate 1 are formed, and the side faces of which are flat.

The first aspect of this invention is a negative type resist in which an alkali-soluble base resin, a crosslinking agent and an acid generating agent are dissolved in a solvent, wherein 10 through 50 wt % of the crosslinking agent and 0.5 through 20 wt % of the acid generating agent on the basis of 100 wt % of the alkali-soluble base resin are dissolved in the solvent. Accordingly, the dissolution rate of the resist layer of this negative type resist with respect to the developer is enhanced after coating it on the surface of the substrate and before irradiating the radiation. Therefore, in developing the resist layer, the contrast of the dissolution rate with respect to the exposure region of the resist layer as compared with that of the non-exposure region thereof, is promoted. The reduction of film and the undercut of the resist pattern are restrained. Thereby, an effect is achieved wherein the resist pattern having a high resolution is provided.

The second aspect of this invention is a negative type resist in which an alkali-soluble base resin, a crosslinking agent and an acid generating agent are dissolved in a solvent, wherein 20 through 40 wt % of the crosslinking agent and 3 through 15 wt % of the acid generating agent on the basis of 100 wt % of the alkali-soluble base resin are dissolved in the solvent. Therefore, the dissolution rate of the resist layer of this negative type resist with respect to the developer is enhanced after coating it on the surface of the substrate and before irradiating the radiation. Therefore, in developing, the contrast of the dissolution rate with respect to the developer in the exposure region of the resist layer as compared with that in the non-exposure region thereof is promoted. The reduction of the film and the undercut of the resist pattern are restrained. Thereby, an effect is achieved wherein the resist pattern having a high resolution is provided.

The third aspect of this invention a method of forming a resist pattern comprising: a step of forming a resist layer comprising a negative type resist of which dissolution rate with respect to a developer is 3,000 Å/sec or more at a surface layer of the resist layer, on a surface of a substrate by coating the negative type resist on the surface of the substrate and by prebaking the negative type resist, said negative type resist becoming slightly soluble or insoluble to the developer when a chemical change is caused to a substance generated by receiving a radiation such as a light beam or an electron beam by baking, or when a chemical change is caused in a substance by receiving the radiation; a total face irradiation step for irradiating the radiation on a total of the surface of the resist layer through an opaque reticle; a selective irradiation step for irradiating the radiation on the surface of the resist layer through a reticle formed with a desired pattern; and a step of providing a resist pattern by developing the resist layer irradiated with the radiation in the total face irradiation step and the selective irradiation step by the developer. Therefore, in developing, the contrast of the dissolution rate with respect to the developer in the exposure region of the resist layer as compared with that in the non-exposure region thereof, is enhanced especially on the side of the portions of the resist contacting the substrate. The dissolution rates in the exposure region of the resist layer on the surface portion and at the portions thereof contacting the substrate are lowered. The difference between the dissolution rates in the exposure region and the non-exposure region of the resist layer on the side of the portions thereof contacting the substrate, is larger than the difference between the dissolution rates in the exposure region and the non-exposure region of the resist layer on the surface portion. The reduction of the film and the undercut of the resist pattern are restrained. Thereby, an effect is achieved wherein the resist pattern having a high resolution and an improved sectional shape is provided.

The fourth aspect of this invention is a method of forming a resist pattern comprising: a step of forming a resist layer comprising a negative type resist on a surface of the resist by coating the negative type resist on the surface of the substrate and by prebaking the negative type resist, said negative type resist becoming slightly soluble or insoluble to a developer when a chemical change is caused in a substance generated by receiving a radiation such as a light beam or an electron beam by baking; a total face irradiation and baking step for irradiating the radiation on a total of a surface of the resist layer through an opaque reticle and baking the resist layer thereafter; a selective irradiation and baking step for irradiating the radiation on the surface of the resist layer through a reticle formed with a desired pattern and baking the resist layer thereafter; and a step of providing a resist pattern by developing the resist layer irradiated with the radiation in the total face irradiation and baking step and the selective irradiation and baking step. Therefore, in developing, the dissolution rates on the surface portion and at the portions contacting the substrate in the exposure region of the resist layer are lowered. The difference between the dissolution rates in the exposure region and the non-exposure region of the resist layer on the side of the portions of the resist contacting the substrate, is larger than the difference between the dissolution rates in the exposure region and the non-exposure region of the resist layer on the surface portion. Further, the influence of the standing wave of the radiation in the exposure region of the resist layer is reduced. The reduction of film and the undercut of the resist pattern are restrained. Thereby, an effect is achieved wherein the resist pattern having a high resolution approximately flat side walls and a good sectional shape are provided.

The fifth aspect of this invention is a method of forming a resist pattern comprising a step of forming a resist layer comprising a negative type resist on a surface of a substrate by coating the negative type resist on the surface of the substrate and prebaking the negative type resist, said negative type resist becoming slightly soluble or insoluble to a developer when a chemical change is caused in a substance generated by receiving a radiation such as a light beam or an electron beam by baking or when a chemical change is caused in a substance by receiving the irradiation; a total face irradiation step for irradiating the radiation on a total of a surface of the resist layer; a selective irradiation step for irradiating the radiation on the surface of the resist layer through a reticle formed with a desired pattern; a step of providing a resist pattern by developing the resist layer irradiated with the radiation in the total face irradiation step and the selective irradiation step by the developer; and wherein a first effective exposure amount applied on the resist layer irradiated with the radiation in the total face irradiation step is 5 through 15% of a second effective exposure amount applied on an exposure region of the resist layer irradiated with the radiation in the selective irradiation step. Therefore, in developing, the dissolution rates in the exposure region of the resist layer on the surface portion and at the portions thereof contacting the substrate are lowered. The difference between the dissolution rates in the exposure region and the non-exposure region of the resist layer on the side of the portions of the resist contacting the substrate, is larger than the difference between the dissolution rates in the exposure region and the non-exposure region of the resist layer on the surface portion. The reduction of the film and the undercut of the resist pattern are restrained. Thereby, an effect is achieved wherein the resist pattern having a high resolution and a good sectional shape are provided.

The sixth aspect of this invention is a method of forming a resist pattern comprising: a step of forming a resist layer comprising a negative type resist on a surface of a substrate by coating the negative type resist on the surface of the substrate and by prebaking the negative type resist, said negative type resist becoming slightly soluble or insoluble to a developer when a chemical change is caused in a substance generated by receiving a radiation such as a light beam or an electron beam by baking or when a chemical change is caused in a substance by receiving the radiation; an irradiation step for irradiating the radiation on a surface of the resist layer through a reticle formed with a desired pattern comprising a light transmitting region and a light shielding layer having a light transmittance of 1 through 20%; and a step of providing a resist pattern by developing the resist layer irradiated with the radiation in the irradiation step by the developer. Therefore, the dissolution rates in the exposure region of the resist layer on the surface portion and the portions thereof contacting the substrate are lowered. The difference between the dissolution rates in the exposure region and the non-exposure region of the resist layer on the side of the portions of the resist contacting the substrate, is larger than the difference between the dissolution rates in the exposure region and the non-exposure region of the resist layer on the surface portion. The reduction of the film and the undercut of the resist pattern are restrained. Thereby, an effect is achieved wherein the resist pattern having a high resolution and a good sectional shape are provided.

The seventh aspect of this invention is a method of forming a resist pattern comprising: a resist layer forming step for forming a resist layer comprising a negative type resist on a surface of a substrate by coating the negative type resist on the surface of the substrate and by prebaking the negative type resist, said negative type resist becoming slightly soluble or insoluble to a developer when a chemical change is caused in a substance generated by receiving a radiation such as a light beam or an electron beam by baking or when a chemical change is caused in a substance by receiving the radiation; an irradiation step for irradiating the radiation on a surface of the resist layer through a reticle formed with a desired pattern comprising a light transmitting region and a light shielding layer having a light transmittance of 3 through 15%; and a step for providing a resist pattern by developing the resist layer irradiated with the radiation in the irradiation step by the developer. Therefore, the dissolution rates in the exposure region of the resist layer on the surface portion and the portions of the resist contacting the substrate are lowered. The difference between the dissolution rates in the exposure region and the non-exposure region of the resist layer on the side of the portions of the resist layer contacting the substrate, is larger than the difference between the dissolution rates in the exposure region and the non-exposure region of the resist layer on the surface portion. The reduction of the film and the undercut of the resist pattern are restrained. Thereby, an effect is achieved wherein the resist pattern having a high resolution and a good sectional shape is provided.

What is claimed is:

1. A method of forming a resist pattern comprising:
    a step of forming a resist layer, on a surface of a substrate by coating the negative resist on the surface of the substrate and by prebaking the negative resist, said negative resist becoming slightly soluble or insoluble to the developer when a chemical change is caused to a substance generated by receiving a radiation such as a light beam or an electron beam by baking, or when a chemical change is caused in a substance by receiving the radiation;
    a total face irradiation step for irradiating the radiation on a total of the surface of the resist layer through an opaque reticle;
    a selective irradiation step for irradiation the radiation on the surface of the resist layer through a reticle formed with a desired pattern; and
    a step of providing a resist pattern by developing the resist layer irradiated with the radiation in the total face irradiation step and the selective irradiation step by the developer, wherein the total face irradiation and the selective irradiation are performed at the same wavelength.

2. The method of forming a resist pattern according to claim 1, wherein a light transmittance of the opaque reticle is 5 through 15%.

3. The method of forming a resist pattern according to claim 1, wherein the total face irradiation step and the selective irradiation step are carried out by a same exposure device.

4. The method of forming a resist pattern according to claim 1, wherein the total face irradiation step is carried out prior to the selective irradiation step.

5. The method of forming a resist pattern according to claim 1, wherein an alkali-soluble base resin, a crosslinking agent and an acid generating agent are dissolved in a solvent in the negative resist.

6. The method of forming a resist pattern according to claim 5, further comprising:
    a step of baking the resist layer after the total face irradiation step; and
    a step of baking the resist layer after the selective irradiation step.

7. A method of forming a resist pattern comprising:

a step of forming a resist layer comprising a negative resist on a surface of a substrate by coating the negative resist on the surface of the substrate and by prebaking the negative resist, said negative resist becoming slightly soluble or insoluble to a developer when a chemical change is caused in a substance generated by receiving a radiation such as a light beam or an electron beam by baking;

a total face irradiation and baking step for irradiating the radiation on a total of a surface of the resist layer through an opaque reticle and baking the resist layer thereafter;

a selective irradiation and baking step for irradiating the radiation on the surface of the resist layer through a reticle formed with a desired pattern and baking the resist layer thereafter;

a step of providing a resist pattern by developing the resist layer irradiated with the radiation in the total face irradiation and baking step and the selective irradiation and baking step, wherein the total face irradiation and the selective irradiation are performed at the same wavelength.

8. The method of forming a resist pattern according to claim 7, wherein a light transmittance of the opaque reticle is 5 through 15%.

9. The method of forming a resist pattern according to claim 7, wherein the irradiation of the radiation in the total face irradiation and baking step and the irradiation of the radiation in the selective irradiation and baking step are carried out by a same exposure device.

10. The method of forming a resist pattern according to claim 7, wherein the total face irradiation and baking step is carried out prior to the selective irradiation and baking step.

11. The method of forming a resist pattern according to claim 7, wherein an alkali-soluble base resin, a crosslinking agent and an acid generating agent are dissolved in a solvent in the negative resist.

12. A method of forming a resist pattern comprising:

a step of forming a resist layer comprising a negative resist on a surface of a substrate by coating the negative resist on the surface of the substrate and prebaking the negative resist, said negative resist becoming slightly soluble or insoluble to a developer when a chemical change is caused in a substance generated by receiving a radiation such as a light beam or an electron beam by baking or when a chemical change is caused in a substance by receiving the irradiation;

a total face irradiation step for irradiating the radiation on a total of a surface of the resist layer, a selective irradiation step for irradiation the radiation on the surface of the resist layer through a reticle formed with a desired pattern;

a step of providing a resist pattern by developing the resist layer irradiated with the radiation in the total face irradiation step and the selective irradiation step by the developer, wherein the total face irradiation and the selective irradiation are performed at the same wavelength.

13. The method of forming a resist pattern according to claim 12, wherein the total face irradiation step and the selective irradiation step are carried out by a same exposure device.

14. The method of forming a resist pattern according to claim 12, wherein the total face irradiation step is carried out prior to the selective irradiation step.

15. The method of forming a resist pattern according to claim 12, wherein an alkali-soluble base resin, a crosslinking agent and an acid generating agent are dissolved in a solvent in the negative resist.

16. The method of forming a resist pattern according to claim 15 further comprising:

a step of baking the resist layer after the total face irradiation step; and a step of baking the resist layer after the selective irradiation step.

17. A method of forming a resist pattern comprising:

a step of forming a resist layer comprising a negative resist on a surface of a substrate by coating the negative resist on the surface of the substrate and prebaking the negative resist, said negative resist becoming slightly soluble or insoluble to a developer comprising an aqueous alkaline solution when a chemical change is caused in a substance generated by receiving a radiation such as a light beam or an electron beam by baking or when a chemical change is caused in a substance by receiving the irradiation;

an irradiation step for irradiating the radiation on a surface of the resist through a reticle formed with a desired pattern comprising a light transmitting region and a light shielding layer having a finite light transmittance; and a step of providing a resist pattern by developing the resist layer irradiated with the radiation in the irradiation step by developer.

18. The method of forming a resist pattern according to claim 17, wherein a dissolution rate of the surface layer of the resist layer with respect to the developer after the resist layer forming step and before the irradiation step is 3,000 Å/sec or more.

19. The method of forming a resist pattern according to claim 17, wherein an alkali-soluble base resin, a crosslinking agent and an acid generating agent are dissolved in a solvent in the negative resist.

20. The method of forming a resist pattern according to claim 17, wherein the light shielding layer of the reticle is a phase shifter layer for transmitting the radiation having a first phase different from a second phase of the radiation transmitting through the light transmitting region.

* * * * *